(12) United States Patent
Rapport et al.

(10) Patent No.: US 7,542,304 B2
(45) Date of Patent: Jun. 2, 2009

(54) MEMORY EXPANSION AND INTEGRATED CIRCUIT STACKING SYSTEM AND METHOD

(75) Inventors: Russell Rapport, Austin, TX (US); James W. Cady, Austin, TX (US); James Wilder, Austin, TX (US); David L. Roper, Austin, TX (US); James Douglas Wehrly, Jr., Austin, TX (US); Jeff Buchle, Austin, TX (US)

(73) Assignee: Entorian Technologies, LP, Austin, TX (US)

( * ) Notice: Subject to any disclaimer, the term of this patent is extended or adjusted under 35 U.S.C. 154(b) by 283 days.

(21) Appl. No.: 10/804,452

(22) Filed: Mar. 19, 2004

(65) Prior Publication Data

US 2005/0057911 A1    Mar. 17, 2005

Related U.S. Application Data

(63) Continuation of application No. PCT/US03/29000, filed on Sep. 15, 2003.

(51) Int. Cl.
*H01R 9/00* (2006.01)
(52) U.S. Cl. ...................................... 361/776; 257/738
(58) Field of Classification Search ................. 257/738; 361/788, 776; 438/107; 710/1
See application file for complete search history.

(56) References Cited

U.S. PATENT DOCUMENTS

| | | | |
|---|---|---|---|
| 3,411,122 A | 11/1968 | Schiller et al. | |
| 3,436,604 A | 4/1969 | Hyltin | ......................... 317/101 |
| 3,654,394 A | 4/1972 | Gordon | |
| 3,746,934 A | 7/1973 | Stein | ......................... 317/101 |
| 3,766,439 A | 10/1973 | Isaacson | |

(Continued)

FOREIGN PATENT DOCUMENTS

DE    004215467 A1    11/1992

(Continued)

OTHER PUBLICATIONS

"Chip Scale Packaging and Redistribution," Paul A. Magill, Glenn A. Rinne, J. Daniel Mis, Wayne C. Machon, Joseph W. Baggs, Unitive Electronics Inc.

(Continued)

*Primary Examiner*—Dean A. Reichard
*Assistant Examiner*—Andargie M Aychillhum
(74) *Attorney, Agent, or Firm*—Fish & Richardson P.C.

(57) ABSTRACT

The present invention stacks integrated circuits (ICs) into modules that conserve PWB or other board surface area. In another aspect, the invention provides a lower capacitance memory expansion addressing system and method and preferably with the CSP stacked modules provided herein. In a preferred embodiment in accordance with the invention, a form standard provides a physical form that allows many of the varying package sizes found in the broad family of CSP packages to be used to advantage while employing a standard connective flex circuitry design. In a preferred embodiment, the form standard will be devised of heat transference material such as copper to improve thermal performance. In a preferred embodiment of the memory addressing system, a high speed switching system selects a data line associated with each level of a stacked module to reduce the loading effect upon data signals in memory access.

17 Claims, 18 Drawing Sheets

U.S. PATENT DOCUMENTS

| | | | |
|---|---|---|---|
| 3,772,776 A | 11/1973 | Weisenburger | 29/628 |
| 3,806,767 A | 4/1974 | Lehrfeld | |
| 3,983,547 A | 9/1976 | Almasi | |
| 4,079,511 A | 3/1978 | Grabbe | |
| 4,288,841 A | 9/1981 | Gogal | 361/414 |
| 4,381,421 A | 4/1983 | Coats et al. | |
| 4,406,508 A | 9/1983 | Sadigh-Behzadi | |
| 4,420,794 A | 12/1983 | Anderson | |
| 4,513,368 A | 4/1985 | Houseman | 364/200 |
| 4,587,596 A | 5/1986 | Bunnell | |
| 4,645,944 A | 2/1987 | Uya | 307/243 |
| 4,696,525 A | 9/1987 | Coller et al. | 439/69 |
| 4,712,129 A | 12/1987 | Orcutt | |
| 4,722,691 A | 2/1988 | Gladd et al. | |
| 4,733,461 A | 3/1988 | Nakano | 29/830 |
| 4,758,875 A | 7/1988 | Fujisawa et al. | |
| 4,821,007 A | 4/1989 | Fields et al. | |
| 4,823,234 A | 4/1989 | Konishi et al. | 361/386 |
| 4,833,568 A | 5/1989 | Berhold | 361/383 |
| 4,839,717 A | 6/1989 | Phy et al. | |
| 4,862,249 A | 8/1989 | Carlson | 357/80 |
| 4,884,237 A | 11/1989 | Mueller et al. | |
| 4,891,789 A | 1/1990 | Quattrini et al. | 365/63 |
| 4,903,169 A | 2/1990 | Kitagawa et al. | |
| 4,911,643 A | 3/1990 | Perry et al. | 439/67 |
| 4,953,060 A | 8/1990 | Lauffer et al. | 361/388 |
| 4,956,694 A | 9/1990 | Eide | 357/74 |
| 4,983,533 A | 1/1991 | Go | 437/7 |
| 4,985,703 A | 1/1991 | Kaneyama | |
| 5,012,323 A | 4/1991 | Farnworth | |
| 5,016,138 A | 5/1991 | Woodman | |
| 5,034,350 A | 7/1991 | Marchisi | |
| 5,041,015 A | 8/1991 | Travis | 439/492 |
| 5,041,902 A | 8/1991 | McShane | |
| 5,050,039 A | 9/1991 | Edfors | |
| 5,057,903 A | 10/1991 | Olla | |
| 5,064,782 A | 11/1991 | Nishiguchi | |
| 5,068,708 A | 11/1991 | Newman | |
| 5,081,067 A | 1/1992 | Shimizu et al. | |
| 5,099,393 A | 3/1992 | Bentlage et al. | 361/413 |
| 5,104,820 A | 4/1992 | Go et al. | |
| 5,117,282 A | 5/1992 | Salatino | 357/81 |
| 5,122,862 A | 6/1992 | Kajihara et al. | |
| 5,138,430 A | 8/1992 | Gow et al. | 357/70 |
| 5,138,434 A | 8/1992 | Wood et al. | |
| 5,158,912 A | 10/1992 | Kellerman et al. | |
| 5,159,434 A | 10/1992 | Kohno et al. | 357/80 |
| 5,159,535 A | 10/1992 | Desai et al. | |
| 5,168,926 A | 12/1992 | Watson et al. | |
| 5,198,888 A | 3/1993 | Sugano et al. | |
| 5,198,965 A | 3/1993 | Curtis et al. | |
| 5,214,307 A | 5/1993 | Davis | |
| 5,219,794 A | 6/1993 | Satoh et al. | |
| 5,222,014 A | 6/1993 | Lin | 361/414 |
| 5,224,023 A | 6/1993 | Smith et al. | 361/412 |
| 5,229,641 A | 7/1993 | Katayama | |
| 5,229,916 A | 7/1993 | Frankeny et al. | |
| 5,239,198 A | 8/1993 | Lin et al. | 257/693 |
| 5,240,588 A | 8/1993 | Uchida | |
| 5,241,454 A | 8/1993 | Ameen et al. | 361/744 |
| 5,243,133 A | 9/1993 | Engle et al. | |
| 5,247,423 A | 9/1993 | Lin et al. | 361/719 |
| 5,252,855 A | 10/1993 | Ogawa et al. | |
| 5,252,857 A | 10/1993 | Kane et al. | |
| 5,259,770 A | 11/1993 | Bates et al. | 439/66 |
| 5,261,068 A | 11/1993 | Gaskins et al. | |
| 5,262,927 A | 11/1993 | Chia et al. | |
| 5,276,418 A | 1/1994 | Klosowiak et al. | |
| 5,281,852 A | 1/1994 | Normington | 257/685 |
| 5,289,062 A | 2/1994 | Wyland | |
| 5,289,346 A | 2/1994 | Carey et al. | |
| 5,313,097 A | 5/1994 | Haj-Ali-Ahmadi et al. | 257/706 |
| 4,437,235 A | 8/1994 | Burns | |
| 5,337,388 A | 8/1994 | Jacobowitz et al. | |
| 5,343,366 A | 8/1994 | Cipolla et al. | |
| 5,345,205 A | 9/1994 | Kornrumpf | |
| 5,347,159 A | 9/1994 | Khandros et al. | |
| 5,347,428 A | 9/1994 | Carson et al. | |
| 5,357,478 A | 10/1994 | Kikuda et al. | |
| 5,361,228 A | 11/1994 | Adachi et al. | |
| 5,362,656 A | 11/1994 | McMahon | |
| 5,375,041 A | 12/1994 | McMahon | 361/749 |
| 5,384,690 A | 1/1995 | Davis et al. | |
| 5,386,341 A | 1/1995 | Olson et al. | |
| 5,394,303 A | 2/1995 | Yamaji | |
| 5,396,573 A | 3/1995 | Ecker et al. | |
| 5,397,916 A | 3/1995 | Normington | |
| 5,428,190 A | 6/1995 | Stopperan | 174/261 |
| 5,432,630 A | 7/1995 | Lebby et al. | |
| 5,438,224 A | 8/1995 | Papageorge et al. | |
| 5,448,511 A | 9/1995 | Paurus et al. | 365/52 |
| 5,477,082 A | 12/1995 | Buckley, III et al. | |
| 5,484,959 A | 1/1996 | Burns | 174/524 |
| 5,502,333 A | 3/1996 | Bertin et al. | |
| 5,509,197 A | 4/1996 | Stone | |
| 5,516,989 A | 5/1996 | Uedo et al. | |
| 5,523,619 A | 6/1996 | McAllister et al. | |
| 5,523,695 A | 6/1996 | Lin | |
| 5,543,664 A | 8/1996 | Burns | 257/787 |
| 5,566,051 A | 10/1996 | Burns | 361/704 |
| 5,572,065 A | 11/1996 | Burns | 257/666 |
| 5,588,205 A | 12/1996 | Roane | |
| 5,594,275 A | 1/1997 | Kwon et al. | |
| 5,610,833 A | 3/1997 | Chang et al. | |
| 5,612,570 A | 3/1997 | Eide et al. | 257/686 |
| 5,620,782 A | 4/1997 | Davis et al. | |
| 5,631,193 A | 5/1997 | Burns | |
| 5,642,055 A | 6/1997 | Difrancesco | 324/757 |
| 5,644,161 A | 7/1997 | Burns | 257/668 |
| 5,644,839 A | 7/1997 | Stone | |
| 5,646,446 A | 7/1997 | Nicewarner, Jr. et al. | |
| 5,654,877 A | 8/1997 | Burns | |
| 5,657,537 A | 8/1997 | Saia et al. | |
| 5,677,569 A | 10/1997 | Choi et al. | |
| 5,717,556 A | 2/1998 | Yanagida | |
| 5,729,894 A | 3/1998 | Rostoker et al. | |
| 5,744,827 A | 4/1998 | Jeong et al. | |
| 5,751,553 A | 5/1998 | Clayton | |
| 5,763,296 A | 6/1998 | Casati et al. | |
| 5,764,497 A | 6/1998 | Mizumo et al. | |
| 5,776,797 A | 7/1998 | Nicewarner, Jr. et al. | 438/107 |
| 5,778,522 A | 7/1998 | Burns | |
| 5,778,552 A | 7/1998 | LeGuin | 33/559 |
| 5,783,464 A | 7/1998 | Burns | |
| 5,789,815 A | 8/1998 | Tessier et al. | |
| 5,790,380 A | 8/1998 | Frankeny | |
| 5,801,437 A | 9/1998 | Burns | 257/685 |
| 5,801,439 A | 9/1998 | Fujisawa et al. | |
| 5,804,870 A | 9/1998 | Burns | |
| 5,805,422 A | 9/1998 | Otake et al. | 361/749 |
| 5,835,988 A | 11/1998 | Ishii | |
| 5,841,721 A | 11/1998 | Kwon et al. | |
| 5,852,326 A | 12/1998 | Khandros et al. | |
| 5,869,353 A | 2/1999 | Levy et al. | 438/109 |
| 5,895,969 A | 4/1999 | Masuda et al. | |
| 5,895,970 A | 4/1999 | Miyoshi et al. | |
| 5,899,705 A | 5/1999 | Akram | |
| 5,917,709 A | 6/1999 | Johnson et al. | 361/803 |
| 5,922,061 A | 7/1999 | Robinson | |
| 5,925,934 A | 7/1999 | Lim | |
| 5,926,369 A | 7/1999 | Ingraham et al. | 361/699 |
| 5,933,712 A | 8/1999 | Bernhardt et al. | |
| 5,949,657 A | 9/1999 | Karabatsos | 361/803 |
| 5,953,215 A | 9/1999 | Karabatsos | |

| | | | | | | |
|---|---|---|---|---|---|---|
| 5,959,839 | A | 9/1999 | Gates | 6,447,321 | B1 | 9/2002 | Perino et al. |
| 5,963,427 | A | 10/1999 | Bollesen | 6,449,159 | B1 | 9/2002 | Haba |
| 5,973,395 | A | 10/1999 | Suzuki et al. | 6,452,826 | B1 | 9/2002 | Kim et al. |
| 5,995,370 | A | 11/1999 | Nakamori | 6,462,408 | B1 | 10/2002 | Wehrly, Jr. |
| 6,002,167 | A | 12/1999 | Hatano et al. | 6,462,412 | B2 | 10/2002 | Kamei et al. ................. 257/723 |
| 6,002,589 | A | 12/1999 | Perino et al. | 6,462,423 | B1 | 10/2002 | Akram et al. |
| 6,013,948 | A | 1/2000 | Akram et al. | 6,465,877 | B1 | 10/2002 | Farnworth et al. .......... 257/668 |
| 6,014,316 | A | 1/2000 | Eide ............ 361/735 | 6,465,893 | B1 | 10/2002 | Khandros et al. ........... 257/777 |
| 6,028,352 | A | 2/2000 | Eide | 6,473,308 | B2 | 10/2002 | Forthun ..................... 361/749 |
| 6,028,365 | A | 2/2000 | Akram et al. ............ 257/778 | 6,486,544 | B1 | 11/2002 | Hashimoto ................. 257/686 |
| 6,034,878 | A | 3/2000 | Osaka et al. | 6,487,078 | B2 | 11/2002 | Kledzik et al. |
| 6,040,624 | A | 3/2000 | Chambers et al. | 6,489,178 | B2 | 12/2002 | Coyle et al. |
| 6,072,233 | A | 6/2000 | Corisis et al. ............ 257/686 | 6,489,687 | B1 | 12/2002 | Hashimoto |
| 6,084,293 | A | 7/2000 | Ohuchi | 6,492,718 | B2 | 12/2002 | Ohmori |
| 6,084,294 | A | 7/2000 | Tomita | 6,500,697 | B2 | 12/2002 | Ahmad |
| 6,084,778 | A | 7/2000 | Malhi | 6,504,104 | B2 | 1/2003 | Hacke et al. |
| 6,097,087 | A | 8/2000 | Farnworth et al. .......... 257/698 | 6,509,639 | B1 | 1/2003 | Lin |
| 6,102,710 | A | 8/2000 | Beilin et al. | 6,514,793 | B2 | 2/2003 | Isaak ......................... 438/109 |
| 6,111,761 | A | 8/2000 | Peana et al. | 6,522,018 | B1 | 2/2003 | Tay et al. |
| 6,114,763 | A | 9/2000 | Smith | 6,528,870 | B2 | 3/2003 | Fukatsu et al. |
| 6,121,676 | A | 9/2000 | Solberg ....................... 257/686 | 6,532,162 | B2 | 3/2003 | Schoenborn |
| RE36,916 | E | 10/2000 | Moshayedi | 6,538,895 | B2 | 3/2003 | Worz et al. |
| 6,130,477 | A | 10/2000 | Chen et al. | 6,549,413 | B2 | 4/2003 | Karnezos et al. |
| 6,157,541 | A | 12/2000 | Hacke | 6,552,910 | B1 | 4/2003 | Moon et al. ................. 361/749 |
| 6,165,817 | A | 12/2000 | Akram | 6,559,521 | B2 | 5/2003 | Tuttle |
| 6,166,443 | A | 12/2000 | Inaba et al. | 6,560,117 | B2 | 5/2003 | Moon ......................... 361/749 |
| 6,172,874 | B1 | 1/2001 | Bartilson ..................... 361/719 | 6,572,387 | B2 | 6/2003 | Burns et al. |
| 6,178,093 | B1 | 1/2001 | Bhatt et al. | 6,576,992 | B1 | 6/2003 | Cady et al. |
| 6,186,106 | B1 | 2/2001 | Glovatsky | 6,588,095 | B2 | 7/2003 | Pan |
| 6,187,652 | B1 | 2/2001 | Chou et al. | 6,590,282 | B1 | 7/2003 | Wang et al. ................. 257/686 |
| 6,205,654 | B1 | 3/2001 | Burns ......................... 29/830 | 6,600,222 | B1 | 7/2003 | Levardo ..................... 257/686 |
| 6,208,521 | B1 | 3/2001 | Nakatsuka ................. 361/749 | 6,608,763 | B1 | 8/2003 | Burns et al. |
| 6,218,731 | B1 | 4/2001 | Huang et al. | 6,614,664 | B2 | 9/2003 | Lee |
| 6,225,688 | B1 | 5/2001 | Kim et al. ................... 257/686 | 6,617,510 | B2 | 9/2003 | Schreiber et al. |
| 6,233,650 | B1 | 5/2001 | Johnson et al. | 6,620,651 | B2 | 9/2003 | He et al. ..................... 438/113 |
| 6,234,820 | B1 | 5/2001 | Perino et al. | 6,624,507 | B1 | 9/2003 | Nguyen et al. |
| 6,236,565 | B1 | 5/2001 | Gordon | 6,627,984 | B2 | 9/2003 | Bruce et al. ................. 257/686 |
| 6,262,895 | B1 | 7/2001 | Forthun | 6,646,333 | B1 | 11/2003 | Hogerl |
| 6,265,660 | B1 | 7/2001 | Tandy ......................... 174/52.4 | 6,657,134 | B2 | 12/2003 | Spielberger et al. |
| 6,265,766 | B1 | 7/2001 | Moden | 6,660,561 | B2 | 12/2003 | Forthun ..................... 438/109 |
| 6,266,252 | B1* | 7/2001 | Karabatsos ................. 361/788 | 6,670,700 | B1 | 12/2003 | Hashimoto |
| 6,271,058 | B1 | 8/2001 | Yoshida | 6,673,651 | B2 | 1/2004 | Ohuchi et al. |
| 6,272,741 | B1 | 8/2001 | Kennedy et al. | 6,677,670 | B2 | 1/2004 | Kondo ....................... 257/686 |
| 6,281,577 | B1 | 8/2001 | Oppermann et al. ........ 257/724 | 6,683,377 | B1 | 1/2004 | Shim et al. |
| 6,285,560 | B1 | 9/2001 | Lyne | 6,689,634 | B1 | 2/2004 | Lyne |
| 6,288,907 | B1 | 9/2001 | Burns | 6,690,584 | B2 | 2/2004 | Uzuka et al. |
| 6,300,679 | B1* | 10/2001 | Mukerji et al. .............. 257/738 | 6,699,730 | B2 | 3/2004 | Kim et al. |
| 6,303,981 | B1 | 10/2001 | Moden | 6,707,148 | B1 | 3/2004 | Mostafazedeh et al. |
| 6,310,392 | B1 | 10/2001 | Burns | 6,707,684 | B1 | 3/2004 | Andric et al. |
| 6,313,998 | B1 | 11/2001 | Kledzik | 6,709,893 | B2 | 3/2004 | Moden et al. |
| 6,316,825 | B1 | 11/2001 | Park et al. | 6,724,076 | B1 | 4/2004 | Kahlisch et al. |
| 6,320,137 | B1 | 11/2001 | Bonser et al. | 6,746,894 | B2 | 6/2004 | Fee et al. |
| 6,323,060 | B1 | 11/2001 | Isaak ......................... 438/109 | 6,762,495 | B1 | 7/2004 | Reyes et al. |
| 6,329,708 | B1 | 12/2001 | Komiyama | 6,762,948 | B2 | 7/2004 | Moon et al. |
| 6,336,262 | B1 | 1/2002 | Dalal et al. | 6,765,288 | B2 | 7/2004 | Damberg |
| 6,351,029 | B1 | 2/2002 | Isaak ......................... 257/688 | 6,768,660 | B2 | 7/2004 | Kong et al. |
| 6,360,433 | B1 | 3/2002 | Ross ........................... 29/840 | 6,773,848 | B1 | 8/2004 | Nortoft et al. |
| 6,360,935 | B1 | 3/2002 | Flake | 6,776,797 | B1 | 8/2004 | Blom |
| 6,368,896 | B2 | 4/2002 | Farnworth et al. .......... 438/113 | 6,778,404 | B1 | 8/2004 | Bolken et al. |
| 6,376,769 | B1 | 4/2002 | Chung ....................... 174/522 | 6,781,240 | B2 | 8/2004 | Choi et al. |
| 6,384,339 | B1 | 5/2002 | Neuman | 6,803,651 | B1 | 10/2004 | Chiang |
| 6,392,162 | B1 | 5/2002 | Karabatsos | 6,812,567 | B2 | 11/2004 | Kim et al. |
| 6,410,857 | B1 | 6/2002 | Gonya ........................ 174/254 | 6,821,029 | B1 | 11/2004 | Grung et al. |
| 6,414,384 | B1 | 7/2002 | Lo et al. | 6,833,984 | B1 | 12/2004 | Belgacem |
| 6,423,622 | B1 | 7/2002 | Chen et al. | 6,841,855 | B2 | 1/2005 | Jaeck et al. |
| 6,426,240 | B2 | 7/2002 | Isaak ......................... 438/106 | 6,849,949 | B1 | 2/2005 | Lyu et al. |
| 6,426,549 | B1 | 7/2002 | Isaak ......................... 257/686 | 6,867,496 | B1 | 3/2005 | Hashimoto |
| 6,426,560 | B1 | 7/2002 | Kawamura et al. | 6,869,825 | B2 | 3/2005 | Chiu |
| 6,433,418 | B1 | 8/2002 | Fujisawa et al. ............ 257/696 | 6,876,074 | B2 | 4/2005 | Kim |
| 6,437,990 | B1 | 8/2002 | Degani et al. | 6,879,047 | B1 | 4/2005 | Heo |
| 6,444,490 | B2 | 9/2002 | Bertin et al. | 6,884,653 | B2 | 4/2005 | Larson |
| 6,444,921 | B1 | 9/2002 | Wang et al. ................. 174/260 | 6,891,729 | B2 | 5/2005 | Ko et al. |
| 6,446,158 | B1 | 9/2002 | Karabatsos ................... 711/5 | 6,893,897 | B2 | 5/2005 | Sweterlitsch |

| | | |
|---|---|---|
| 6,908,792 B2 | 6/2005 | Bruce et al. |
| 6,914,324 B2 | 7/2005 | Rapport et al. |
| 6,919,626 B2 | 7/2005 | Burns |
| 6,965,166 B2 | 11/2005 | Hikita et al. |
| 6,998,704 B2 | 2/2006 | Yamazaki et al. |
| 7,023,701 B2 | 4/2006 | Stocken et al. |
| 7,081,373 B2 | 7/2006 | Roeters et al. |
| 7,104,804 B2 | 9/2006 | Batinovich |
| 7,129,571 B2 | 10/2006 | Kang |
| 7,235,871 B2 * | 6/2007 | Corisis ............... 257/686 |
| 2001/0006252 A1 | 7/2001 | Kim et al. |
| 2001/0013423 A1 | 8/2001 | Dalal et al. |
| 2001/0015487 A1 | 8/2001 | Forthun |
| 2001/0035572 A1 | 11/2001 | Isaak |
| 2001/0040793 A1 | 11/2001 | Inaba ............... 361/749 |
| 2002/0006032 A1 | 1/2002 | Karabatsos ........... 361/760 |
| 2002/0030995 A1 | 3/2002 | Shoji |
| 2002/0044423 A1 | 4/2002 | Primavera et al. |
| 2002/0048849 A1 | 4/2002 | Isaak |
| 2002/0076919 A1 | 6/2002 | Peters et al. |
| 2002/0101261 A1 | 8/2002 | Karabatsos ........... 326/83 |
| 2002/0114143 A1 | 8/2002 | Morrison et al. |
| 2002/0126951 A1 | 9/2002 | Sutherland et al. |
| 2002/0139577 A1 | 10/2002 | Miller ............... 174/261 |
| 2002/0164838 A1 | 11/2002 | Moon et al. ........... 438/107 |
| 2002/0180022 A1 | 12/2002 | Emoto ............... 257/686 |
| 2003/0016710 A1 | 1/2003 | Kamoto |
| 2003/0045025 A1 | 3/2003 | Coyle et al. |
| 2003/0049886 A1 | 3/2003 | Salmon |
| 2003/0081392 A1 | 5/2003 | Cady et al. |
| 2003/0107118 A1 | 6/2003 | Pflughaupt et al. |
| 2003/0109078 A1 | 6/2003 | Takahashi et al. |
| 2003/0113998 A1 | 6/2003 | Ross |
| 2003/0164551 A1 | 9/2003 | Lee et al. |
| 2003/0168725 A1 | 9/2003 | Warner et al. ......... 257/686 |
| 2004/0000708 A1 | 1/2004 | Rapport et al. |
| 2004/0004281 A1 | 1/2004 | Bai et al. |
| 2004/0021211 A1 | 2/2004 | Damberg ............. 257/282 |
| 2004/0031972 A1 | 2/2004 | Pflughaupt et al. |
| 2004/0045159 A1 | 3/2004 | DiStefano et al. |
| 2004/0065963 A1 | 4/2004 | Karnezos |
| 2004/0075991 A1 | 4/2004 | Haba et al. |
| 2004/0099938 A1 | 5/2004 | Kang et al. |
| 2004/0104470 A1 | 6/2004 | Bang et al. |
| 2004/0115866 A1 | 6/2004 | Bang et al. |
| 2004/0150107 A1 | 8/2004 | Cha et al. ............ 257/738 |
| 2004/0157362 A1 | 8/2004 | Beroz et al. |
| 2004/0203190 A1 | 10/2004 | Pflughaupt et al. |
| 2004/0217461 A1 | 11/2004 | Damberg |
| 2004/0217471 A1 | 11/2004 | Haba |
| 2004/0238931 A1 | 12/2004 | Haba et al. |
| 2004/0245617 A1 | 12/2004 | Damberg et al. |
| 2004/0267409 A1 | 12/2004 | De Lorenzo et al. |
| 2005/0018495 A1 | 1/2005 | Bhakta et al. |
| 2005/0035440 A1 | 2/2005 | Mohammed |
| 2005/0040508 A1 | 2/2005 | Lee |
| 2005/0047250 A1 | 3/2005 | Ruckerbauer et al. |
| 2005/0133897 A1 | 6/2005 | Baek et al. |
| 2005/0251586 A1 * | 11/2005 | Lin ................... 710/1 |

FOREIGN PATENT DOCUMENTS

| | | |
|---|---|---|
| DE | 004214102 A1 | 12/1992 |
| EP | 0 298 211 A | 1/1989 |
| EP | 0426-303 (A2) | 10/1990 |
| JP | 58-96756(A) | 6/1983 |
| JP | 58-112348(A) | 7/1983 |
| JP | 359088863 (A) | 5/1984 |
| JP | 60-254762 | 12/1985 |
| JP | 60254762 | 12/1985 |
| JP | 3641047659 (A) | 3/1986 |
| JP | 62-230027(A) | 10/1987 |
| JP | 4-209562 (A) | 7/1992 |
| JP | 404368167 (A) | 12/1992 |
| JP | 5029534 (A) | 2/1993 |
| JP | 63-153849 (A) | 6/1998 |
| JP | 2000-88921 | 3/2000 |
| JP | 2000/307029 (A) | 11/2000 |
| JP | 2001077294(A) | 3/2001 |
| JP | 2001085592(A) | 3/2001 |
| JP | 2001332683(A) | 11/2001 |
| JP | 2003037246(A) | 2/2003 |
| JP | 2003086760(A) | 3/2003 |
| JP | 2003086761(A) | 3/2003 |
| JP | 2003/309247 (A) | 10/2003 |
| JP | 2003309246(A) | 10/2003 |
| JP | 2003/347475 (A) | 12/2003 |
| JP | 2003/347503 (A) | 12/2003 |
| WO | WO9744824 | 11/1997 |
| WO | WO 03/037053 A1 | 5/2003 |

OTHER PUBLICATIONS

"3D Interconnection for Ultra-Dense Multichip Modules," Christian VAL, Thomson-CSF DCS Computer Division, Thierry Lemoine, Thomson-CSF RCM Radar Countermeasures Division.

"High Density Memory Packaging Technology High Speed Imaging Applications," Dean Frew, Texas Instruments Incorporated.

Teresa Technologies, Inc.—Semiconductor Intellectual Property, Chip Scale Packaging—Website pages (3).

PCT/US2006/017015, International Search Report and Written Opinion dated Oct. 17, 2006.

PCT/US2005/013345, International Preliminary Report on Patentability dated Nov. 2, 2006.

PCT/US2005/016764; International Preliminary Report on Patentability dated Nov. 23, 2006.

PCT/2005/010756, International Search Report and Written Opinion dated Oct. 12, 2006.

PCT/US2005/010756, International Preliminary Report on Patentability dated Apr. 12, 2007.

PCT/US2005/039307, International Search Report and Written Opinion dated Sep. 26, 2006.

PCT/US2005/013336, International Preliminary Report on Patentability dated Nov. 9, 2006.

Howard W. Markstein, Western Editor, Rigid-Flex: A Maturing Technology dated Feb. 1996, Electronic Packaging & Production.

Design Requirements for Outlines of Solid State and Related Products, Ball Grid Array Package (BGA), Sep. 2005, Jedec Publication 95.

William R. Newberry, Xynetix Design Systems, Inc., Design Techniques for Ball Grid Arrays, 1997 published on the Internet.

1992 Proceedings, 42nd Electronic Components & Technology Conference, May 18-20, 1992.

Research Disclosure, Organic Card Device Carrier, 31318, May 1990, No. 313.

IBM Technical Disclosure Bulletin, vol. 23, No. 12, May 1981.

IBM Technical Disclosure Bulletin, vol. 20, No. 11A, Apr. 1978.

IBM Technical Disclosure Bulletin, vol. 32, No. 3B, Aug. 1989.

Orthogonal Chip Mount—A 3D Hybrid Wafer Scale Integration Technology, International Electron Device Meeting, IEDM Technical Digest, Washington, D.C., Dec. 6-9, 1987.

"Tessera Introduces uZ™—Ball Stacked Memory Package for Computing and Portable Electronic Products" Joyce Smaragdis, Tessera Public Relations; 2 figures that purport to be directed to the uZ™ —Ball Stacked Memory Package.

Ron Bauer, Intel. "Stacked-CSP Delivers Flexibility, Reliability, and Space-Saving Capabilities", Spring 2002.

Tessera uZ Ball Stack Package. 4 figures that purport to be directed to the uZ—Ball Stacked Memory, 1 Page.

"Vertically-Intergrated Package," Alvin Weinberg, Pacesetter, Inc. and W. Kinzy Jones, Florida International University.

Dense-Pac Microsystems, 256 Megabyte CMOS DRAM DP3ED32MS72RW5.

IBM Preliminary 168 Pin SDRAM Registered DIMM Functional Description & Timing Diagrams.

* cited by examiner

MEMORY EXPANSION AND INTEGRATED CIRCUIT STACKING SYSTEM AND METHOD

RELATED APPLICATIONS

This application is a continuation of PCT Pat. App. No. PCT/US03/29000 filed Sep. 15, 2003, which is pending.

TECHNICAL FIELD

The present invention relates to aggregating integrated circuits and, in particular, to stacking integrated circuits in chip-scale packages and providing such stacked integrated circuits on boards.

BACKGROUND OF THE INVENTION

A variety of techniques are used to stack packaged integrated circuits. Some methods require special packages, while other techniques stack conventional packages. In some stacks, the leads of the packaged integrated circuits are used to create a stack, while in other systems, added structures such as rails provide all or part of the interconnection between packages. In still other techniques, flexible conductors with certain characteristics are used to selectively interconnect packaged integrated circuits.

A predominant package configuration employed during the past decade has encapsulated an integrated circuit (IC) in a plastic surround typically having a rectangular configuration. The enveloped integrated circuit is connected to the application environment through leads emergent from the edge periphery of the plastic encapsulation. Such "leaded packages" have been the constituent elements most commonly employed by techniques for stacking packaged integrated circuits.

Leaded packages play an important role in electronics, but efforts to miniaturize electronic components and assemblies have driven development of technologies that preserve circuit board surface area. Because leaded packages have leads emergent from peripheral sides of the package, leaded packages occupy more than a minimal amount of circuit board surface area. Consequently, alternatives to leaded packages known as chip scale packaging or "CSP" have recently gained market share.

CSP refers generally to packages that provide connection to an integrated circuit through a set of contacts (often embodied as "bumps" or "balls") arrayed across a major surface of the package. Instead of leads emergent from a peripheral side of the package, contacts are placed on a major surface and typically emerge from the planar bottom surface of the package.

The goal of CSP is to occupy as little area as possible and, preferably, approximately the area of the encapsulated IC. Therefore, CSP leads or contacts do not typically extend beyond the outline perimeter of the package. The absence of "leads" on package sides renders most stacking techniques devised for leaded packages inapplicable for CSP stacking.

There are several known techniques for stacking packages articulated in chip scale technology. The assignee of the present invention has developed previous systems for aggregating FBGA packages in space saving topologies. The assignee of the present invention has systems for stacking BGA packages on a DIMM in a RAMBUS environment.

In U.S. Pat. No. 6,205,654 B1, owned by the assignee of the present invention, a system for stacking ball grid array packages that employs lead carriers to extend connectable points out from the packages is described. Other known techniques add structures to a stack of BGA-packaged ICs. Still others aggregate CSPs on a DIMM with angular placement of the packages. Such techniques provide alternatives, but require topologies of added cost and complexity.

U.S. Pat. No. 6,262,895 B1 to Forthun (the "Forthun patent") purports to disclose a technique for stacking chip scale packaged ICs. The Forthun patent discloses a "package" that exhibits a flex circuit wrapped partially about a CSP. The flex circuit is said to have pad arrays on upper and lower surfaces of the flex.

The flex circuit of the Forthun "package" has a pad array on its upper surface and a pad array centrally located upon its lower surface. On the lower surface of the flex there are third and fourth arrays on opposite sides from the central lower surface pad array. To create the package of Forthun, a CSP contacts the pad array located on the upper surface of the flex circuit. As described in the Forthun patent, the contacts on the lower surface of the CSP are pushed through "slits" in the upper surface pads and advanced through the flex to protrude from the pads of the lower surface array and, therefore, the bottom surface of the package. Thus, the contacts of the CSP serve as the contacts for the package. The sides of the flex are partially wrapped about the CSP to adjacently place the third and fourth pad arrays above the upper major surface of the CSP to create from the combination of the third and fourth pad arrays, a fifth pad array for connection to another such package. Thus, as described in the Forthun disclosure, a stacked module of CSPs created with the described packages will exhibit a flex circuit wrapped about each CSP in the module.

Memory expansion is one of the many fields in which stacked module solutions provide advantages. For example, the well-known DIMM board is frequently populated with stacked modules from those such as the assignee of the present invention. This adds capacity to the board without adding sockets.

A memory expansion board such as a DIMM, for example, provides plural sites for memory IC placement (i.e., sockets) arranged along both major surfaces of a board having an array of contacts dispersed along at least one board edge. Although stacking reduces interconnect length per unit of memory, and thus takes advantage of the general rule that interconnects that are less than half the spatial extent of the leading edge of a signal operate as a lumped element more than a transmission line, it does increase the raw number of devices on a DIMM board. Consequently, despite the reduction in interconnect length per unit of memory, signals accessing data stored in memory circuits physically placed on the DIMM board are typically presented with relatively high impedance as the number of devices on the bus is increased by stacking.

What is needed are methods and structures for stacking circuits in thermally efficient, reliable structures that perform well at higher frequencies but do not exhibit excessive height yet allow production at reasonable cost with readily understood and managed materials and methods and addressing systems that allow significant reductions in interconnect lengths and/or loading when employed in memory expansion boards and design.

SUMMARY OF THE INVENTION

The present invention stacks integrated circuits (ICs) into modules that conserve PWB or other board surface area. The present invention can be used to advantage with CSP or leaded packages of a variety of sizes and configurations ranging from larger packaged base elements having many dozens of contacts to smaller packages such as, for example, die-sized packages such as DSBGA.

Multiple numbers of CSPs may be stacked in accordance with the present invention. A four-high CSP stacked module is preferred for use with the disclosed high performance memory access system while, for many applications, a two-high CSP stack or module devised in accordance with a preferred embodiment of the present invention is preferred. The ICs employed in stacked modules devised in accordance with the present invention are connected with flex circuitry. That flex circuitry may exhibit one or two or more conductive layers with preferred embodiments having two conductive layers.

A form standard provides a physical form that allows many of the varying package sizes found in the broad family of CSP packages to be used to advantage while employing a standard connective flex circuitry design. In preferred modules, the flex circuitry is partially wrapped about a form standard. The form standard can take many configurations and may be used where flex circuitry is used to connect ICs to one another in stacked modules having two or more constituent ICs. For example, in stacked modules that include four levels of CSPs, three form standards are employed in preferred embodiments, although fewer may be used. In a preferred embodiment, the form standard will be devised of heat transference material, a metal for example, such as copper would be preferred, to improve thermal performance.

In an alternative preferred embodiment devised in accordance with the present invention, a base element IC and one or more support element ICs are aggregated through a flex circuit having two conductive layers that are patterned to selectively connect the two IC elements. Simpler embodiments may use a one conductive layer flex. A portion of the flex circuit connected to the support element is folded over the base element and about the form standard to dispose the support element(s) above the base element while reducing the overall footprint occupied by the ICs. The flex circuit connects the ICs and provides a thermal and electrical connection path between the module and an application environment such as a printed wiring board (PWB).

In another aspect, the invention provides a lower capacitance memory expansion addressing system and method and preferably with the CSP stacked modules provided herein. In a preferred embodiment of the present invention, four-high stacked CSP modules are disposed on a memory expansion board(s) in accordance with the memory expansion system and methods of the present invention which may be employed with CSP or other IC stacked modules. A high speed switching system selects a data line associated with each level of a stacked module to reduce the loading effect upon data signals in memory access. This favorably changes the impedance characteristics exhibited by the board loading. The high speed DQ selection switch may be implemented, in a preferred embodiment, for example, with a high speed FET switch. FET multiplexers, for example, under logic control, select particular data lines associated with particular levels of the DIMM-populated stacked modules for connection to a controlling chip set in a memory expansion system in accordance with a preferred embodiment.

DESCRIPTION OF PREFERRED EMBODIMENTS

Figure 1:
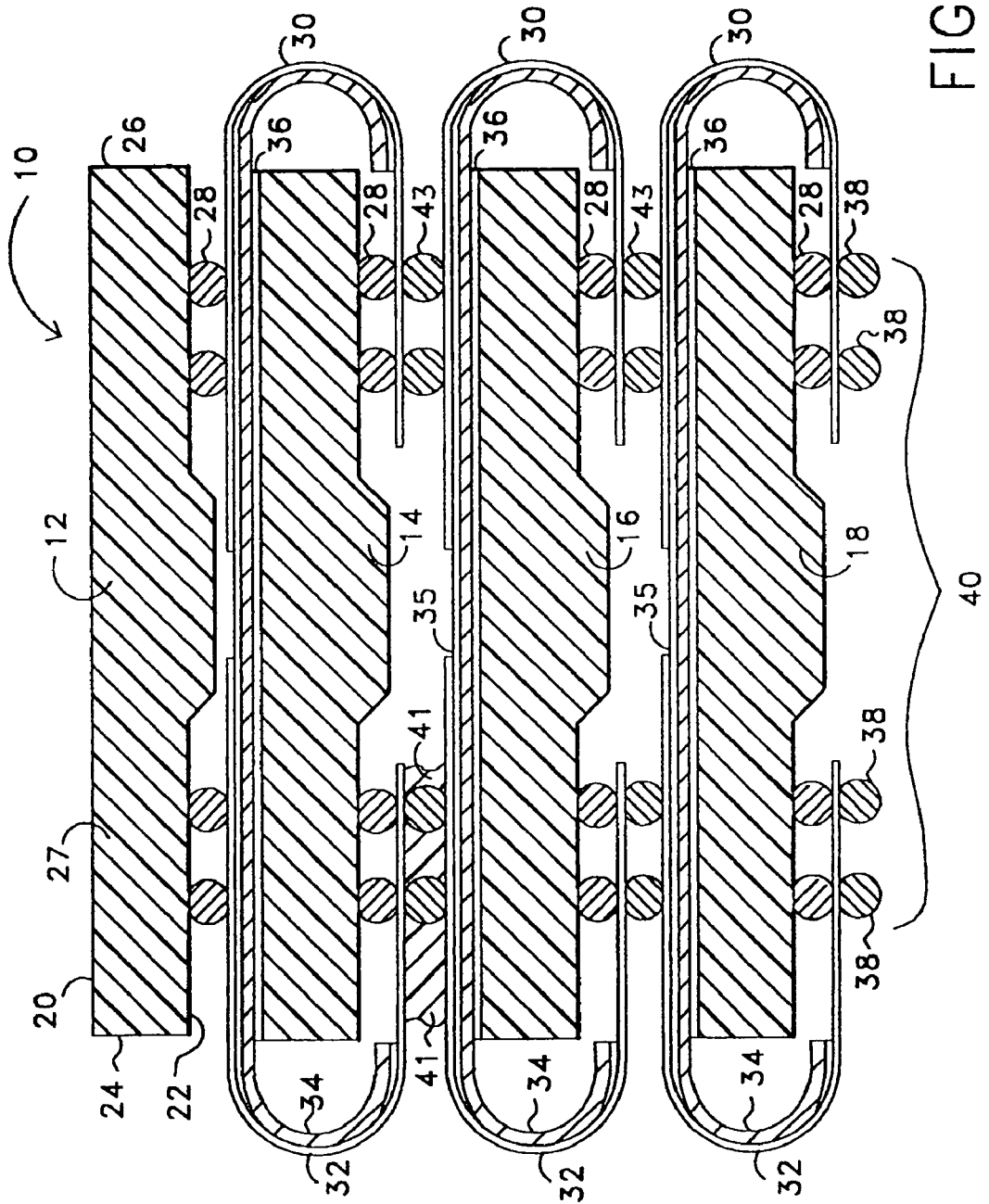
FIG. 1 is an elevation view of a high-density circuit module devised in accordance with a preferred four-high embodiment of the present invention.

FIG. 1 is an elevation view of module 10 devised in accordance with a preferred embodiment of the present invention. Module 10 is comprised of four CSPs: level four CSP 12, level three CSP 14, level two CSP 16, and level one CSP 18. Each of the CSPs has an upper surface 20 and a lower surface 22 and opposite 20 lateral edges 24 and 26 and typically include at least one integrated circuit surrounded by a plastic body 27. The body need not be plastic, but a large majority of packages in CSP technologies are plastic. Those of skill will realize that the present invention may be devised to create modules with different size CSPs and that the constituent CSPs may be of different types within the same module 10. For example, one of the constituent CSPs may be a typical CSP having lateral edges 24 and 26 that have an appreciable height to present a "side" while other constituent CSPs of the same module 10 may be devised in packages that have lateral edges 24 and 26 that are more in the character of an edge rather than a side having appreciable height.

The invention is used with CSP packages of a variety of types and configurations such as, for example, those that are die-sized, as well those that are near chip-scale as well as the variety of ball grid array packages known in the art. It may also be used with those CSP-like packages that exhibit bare die connectives on one major surface. Thus, the term "CSP" should be broadly considered in the context of this application. Collectively, these will be known herein as chip scale packaged integrated circuits (CSPs) and some preferred embodiments will be described in terms of CSPs, but the particular configurations used in the explanatory figures are not, however, to be construed as limiting.

Figure 2:
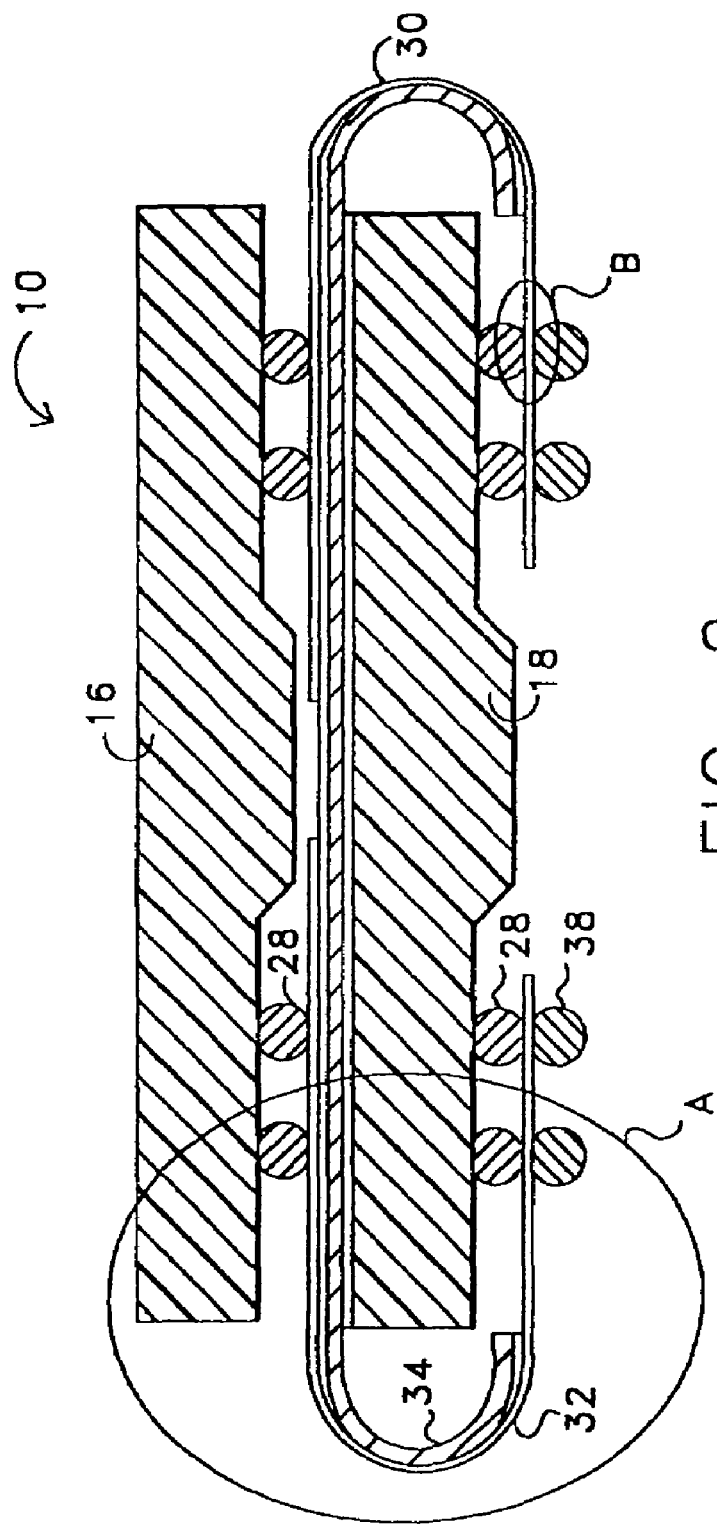
FIG. 2 is an elevation view of a stacked high-density circuit module devised in accordance with a preferred two-high embodiment of the present invention.

A variety of combinations of packages including leaded and CSP and other configurations of packaged ICs may be employed to advantage by the invention. For example, the elevation views of FIGS. 1 and 2 are depicted with CSPs of a particular profile known to those in the art, but it should be understood that the figures are exemplary only.

Later figures show embodiments of the invention that employ CSPs of other configurations aggregated with leaded packages as an example of some of the many alternative IC package configurations and combinations with which the invention may be employed. A system of the invention may also be employed with leaded packages while the module itself presents an array of bumps or balls to the application environment.

Typical CSPs, such as, for example, ball-grid-array ("BGA"), micro-ball-grid array, and fine-pitch ball grid array ("FBGA") packages have an array of connective contacts embodied, for example, as leads, bumps, solder balls, or balls that extend from lower surface 22 of a plastic casing in any of several patterns and pitches. An external portion of the connective contacts is often finished with a ball of solder. Shown in FIG. 1 are contacts 28 along lower surfaces 22 of the illustrated constituent CSPs 12, 14, 16, and 18. Contacts 28 provide connection to the integrated circuit or circuits within the respective packages. In embodiments of the present invention, module 10 may be devised to present a lower profile by stripping from the respective CSPs, the balls depicted in FIG. 1 as contacts 28 and providing a connection facility at contact 28 that results from solder paste that is applied either to the pad contact of the CSP that is typically present under or within the typical ball contacts provided on CSP devices or to the contact sites on the flex circuitry to be connected to contact 28.

In FIG. 1, iterations of flex circuits ("flex", "flex circuits" or "flexible circuit structures") 30 and 32 are shown connecting various constituent CSPs. Some embodiments may employ more than one flex. The entire flex circuit may be flexible or, as those of skill in the art will recognize, a PCB structure made flexible in certain areas to allow conformability in some areas and rigid in other areas for planarity along contact surfaces may be employed as an alternative flex circuit in the present invention. For example, structures known as rigid-flex may be employed.

Form standard 34 is shown disposed adjacent to upper surface 20 of each of the CSPs below level four CSP 12. Form standard 34 may be fixed to upper surface 20 of the respective CSP with an adhesive 35 which preferably is thermally conductive. Form standard 34 may also, in alternative embodiments, merely lay on upper surface 20 or be separated from upper surface 20 by an air gap or medium such as a thermal slug or non-thermal layer. However, where form standard 34 is a thermally conductive material such as the copper that is employed in a preferred embodiment, layers or gaps interposed between form standard 34 and the respective CSP (other than thermally conductive layers such as adhesive) are not highly preferred.

Figure 14:
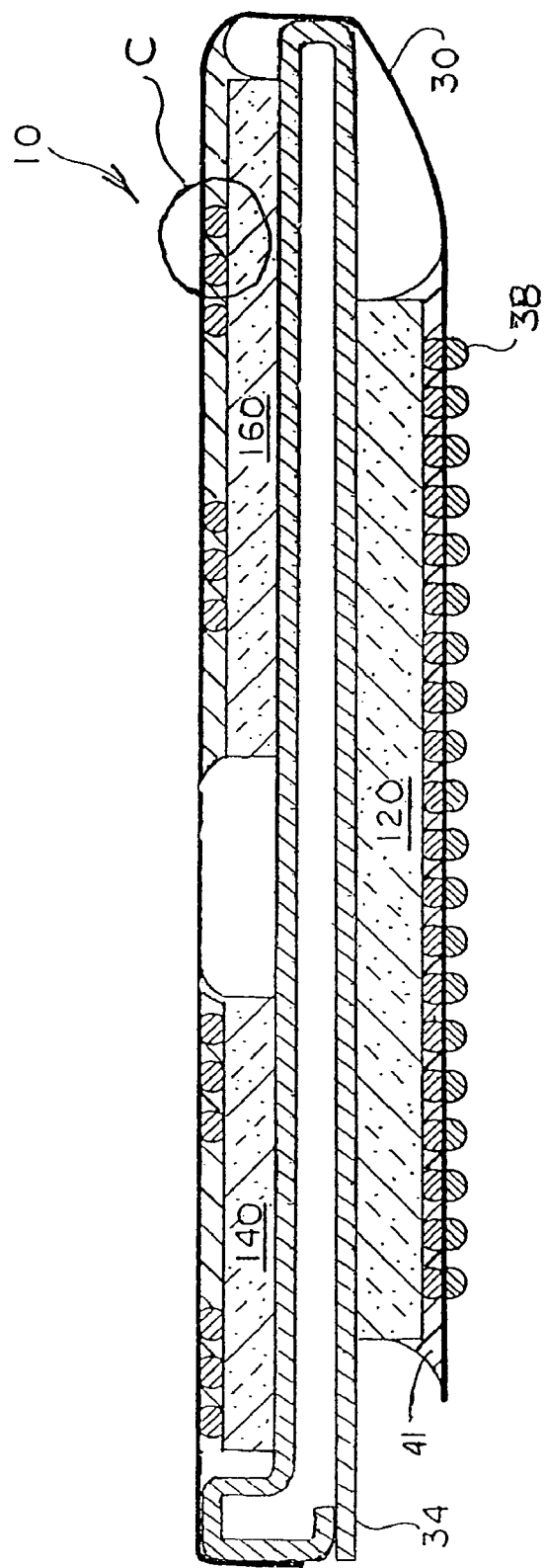
FIG. 14 is an elevation view of a module that depicts an alternative preferred embodiment of the present invention.

Form standard 34 is, in a preferred embodiment, devised from copper to create, as shown in the depicted preferred embodiment of FIG. 1, a mandrel that mitigates thermal accumulation while providing a standard sized form about which flex circuitry is disposed. Form standard 34 may take other shapes and forms such as for example, an angular "cap" that rests upon the respective CSP body or as another example, it may be folded to increase its cooling surface area while providing an appropriate axial form for the flex that is wrapped about a part of form standard 34 as shown in later FIG. 14. It also need not be thermally enhancing although such attributes are preferable. The form standard 34 allows the invention to be employed with CSPs of varying sizes, while articulating a single set of connective structures useable with the varying sizes of CSPs. Thus, a single set of connective structures such as flex circuits 30 and 32 (or a single flexible circuit in the mode where a single flex is used in place of the flex circuit pair 30 and 32) may be devised and used with the form standard 34 method and/or systems disclosed herein to create stacked modules with CSPs having different sized packages. This will allow the same flexible circuitry set design to be employed to create iterations of a stacked module 10 from constituent CSPs having a first arbitrary dimension X across attribute Y (where Y may be, for example, package width), as well as modules 10 from constituent CSPs having a second arbitrary dimension X prime across that same attribute Y. Thus, CSPs of different sizes may be stacked into modules 10 with the same set of connective structures (i.e. flex circuitry). Further, as those of skill will recognize, mixed sizes of CSPs may be implemented into the same module 10, such as would be useful to implement embodiments of a system-on-a-stack an example of which is shown in FIG. 14.

Preferably, portions of flex circuits 30 and 32 are fixed to form standard 34 by adhesive 35 which is preferably a tape adhesive, but may be a liquid adhesive or may be placed in discrete locations across the package. Preferably, adhesive 35 is thermally conductive.

In a preferred embodiment, flex circuits 30 and 32 are multi-layer flexible circuit structures that have at least two conductive layers. Other embodiments may, however, employ flex circuitry, either as one circuit or two flex circuits, that have only a single conductive layer.

Preferably, the conductive layers are metal such as alloy 110. The use of plural conductive layers provides advantages and the creation of a distributed capacitance across module 10 intended to reduce noise or bounce effects that can, particularly at higher frequencies, degrade signal integrity, as those of skill in the art will recognize. Module 10 of FIG. 1 has plural module contacts 38 collectively identified as module array 40. Connections between flex circuits are shown as being implemented with inter-flex contacts 43 which are shown as balls but may be low profile contacts constructed with pads and/or rings that are connected with solder paste applications to appropriate connections. Appropriate fills such as those indicated by conformal media reference 41 can provide added structural stability and coplanarity where desired. Media 41 is shown only as to CSPs 14 and 16 and only on one side to preserve clarity of view.

FIG. 2 shows a two-high module 10 devised in accordance with a preferred embodiment of the invention. FIG. 2 has an area marked "A" that is subsequently shown in enlarged depiction in FIG. 3 and an area marked "B" that is shown subsequently in enlarged depiction in FIG. 4.

Figure 3:
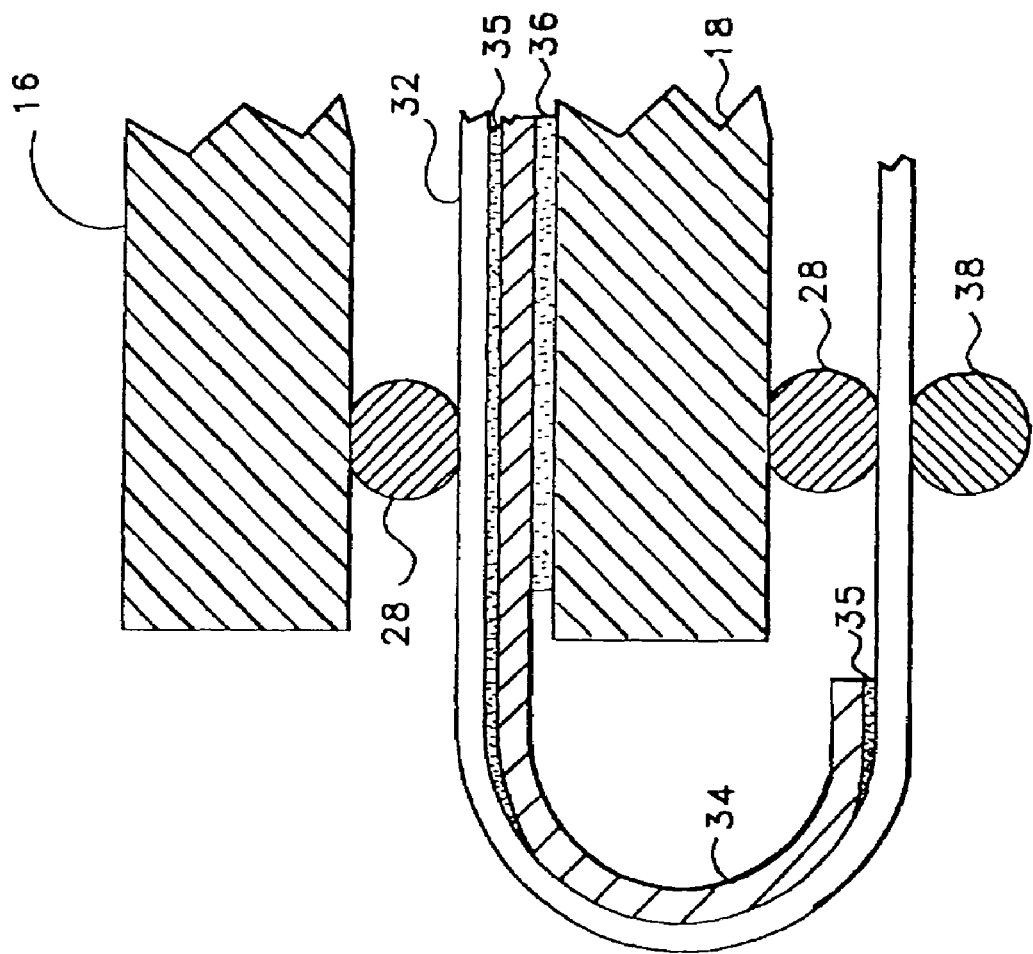
FIG. 3 depicts, in enlarged view, the area marked "A" in FIG. 2.

FIG. 3 depicts in enlarged view, the area marked "A" in FIG. 2. FIG. 3 illustrates in a preferred embodiment, one arrangement of a form standard 34 and its relation to flex circuitry 32 in a two-high module 10. The internal layer constructions of flex circuitry 32 are not shown in this figure. Also shown are adhesives 35 between flex circuit 32 and form standard 34. Those of skill will note that adhesive 35 is not required but is preferred and the site of its application may be determined as being best for this embodiment in the area between CSPs with a smaller amount near the terminal point of form standard 34 as shown in FIG. 3. Also shown in FIG. 3 is an application of adhesive 36 between form standard 34 and CSP 18.

Figure 4:
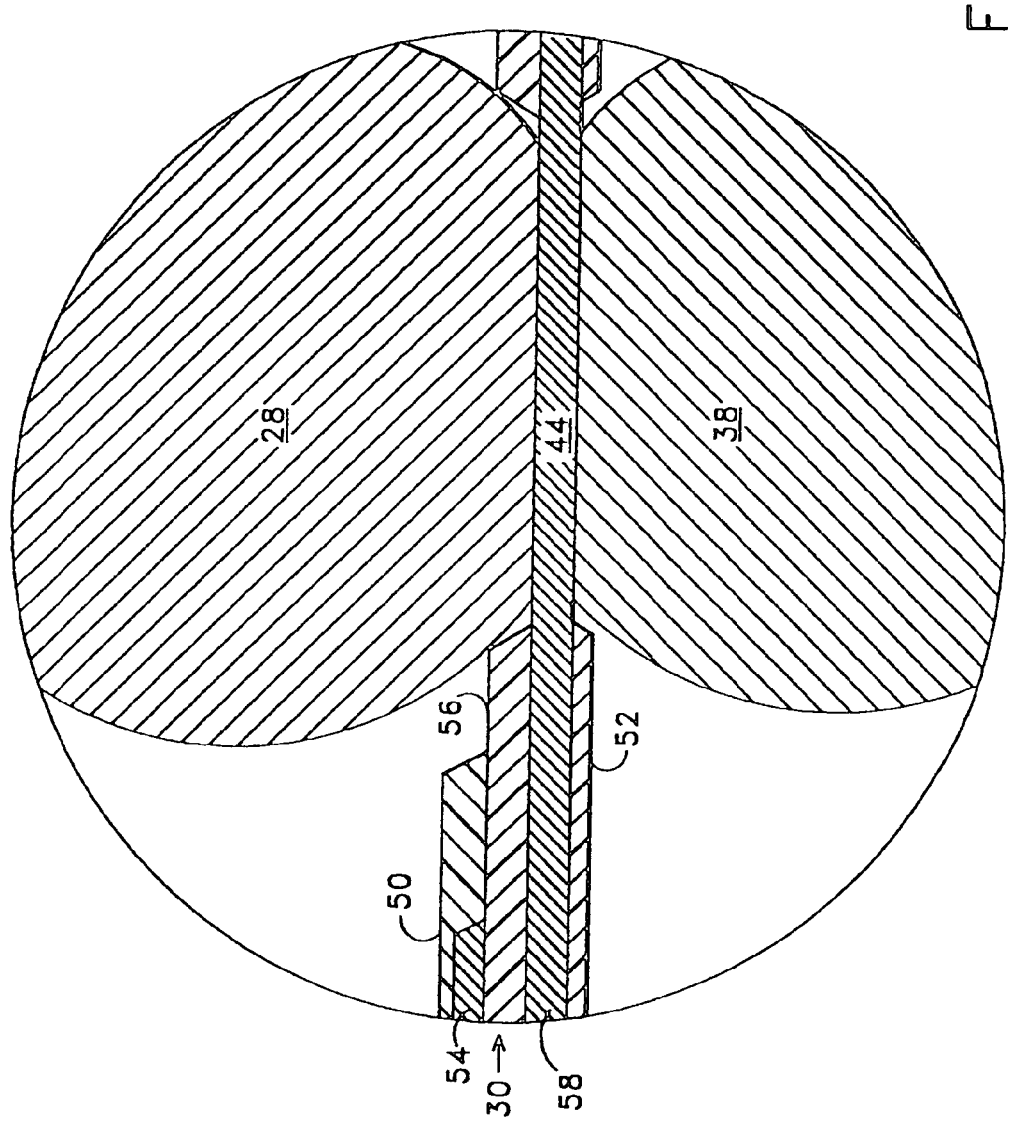
FIG. 4 depicts in enlarged view, the area marked "B" in FIG. 2.

FIG. 4 illustrates the connection between example contact 28 and module contact 38 through a lower flex contact 44 to illustrate a preferred solid metal path from level one CSP 18 to module contact 38 and, therefore, to an application PWB or memory expansion board to which the module is connectable. As depicted in FIG. 4 lower flex contact 44 is preferably comprised from metal at the level of second conductive layer 58 interior to second outer surface 52. As those of skill in the art will understand, heat transference from module 10 is thereby encouraged.

Flex 30 is shown in FIG. 4 to be comprised of multiple layers. This is merely an exemplar flexible circuitry that may be employed with the present invention. Single conductive layer and other variations on the described flexible circuitry may, as those of skill will recognize, be employed to advantage in the present invention. Flex 30 has a first outer surface 50 and a second outer surface 52. Flex circuit 30 has at least two conductive layers interior to first and second outer surfaces 50 and 52. There may be more than two conductive layers in flex 30 and flex 32. In the depicted preferred embodiment, first conductive layer or plane 54 and second conductive layer or plane 58 are interior to first and second outer surfaces 50 and 52. Intermediate layer 56 lies between first conductive layer 54 and second conductive layer 58. There may be more than one intermediate layer, but one intermediate layer of polyimide is preferred.

Figure 5:
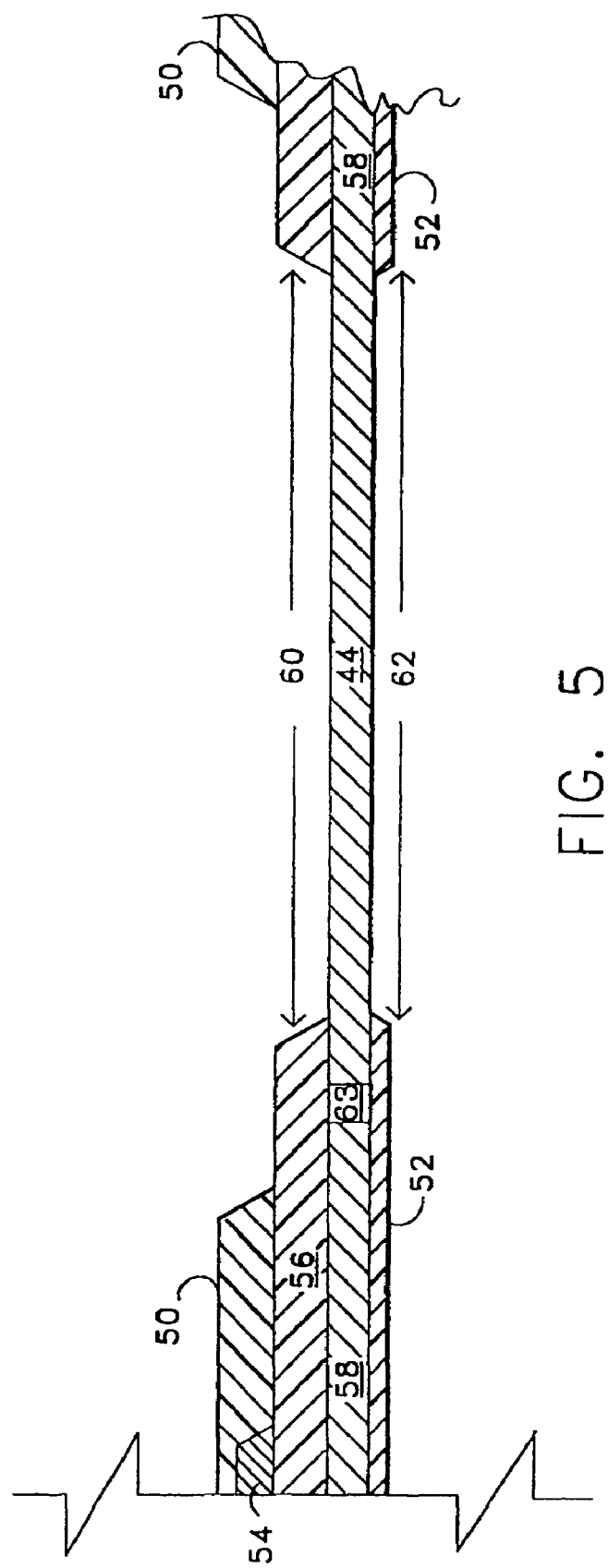
FIG. 5 is an enlarged depiction of an exemplar connection area in a stacked module devised in accordance with a preferred embodiment.

FIG. 5 is an enlarged depiction of an exemplar area around a lower flex contact 44 in a preferred embodiment. Windows 60 and 62 are opened in first and second outer surface layers 50 and 52 respectively, to provide access to particular lower flex contacts 44 residing at the level of second conductive layer 58 in the flex. In a two-high embodiment of module 10, the upper flex contacts 42 are contacted by contacts 28 of second level CSP 16. In the depicted preferred embodiment, lower flex contacts 44 and upper flex contacts 42 are particular areas of conductive material (preferably metal such as alloy 110) at the level of second conductive layer 58 in the flex. Upper flex contacts 42 and lower flex contacts 44 are demarked in second conductive layer 58 and may be connected to or isolated from the conductive plane of second conductive layer 58. Demarking a lower flex contact 44 from second conductive layer 58 is represented in FIG. 5 by demarcation gap 63 shown at second conductive layer 58. Where an upper or lower flex contact 42 or 44 is not completely isolated from second conductive layer 58, demarcation gaps do not extend completely around the flex contact. Contacts 28 of first level CSP 18 pass through a window 60 opened through first outer surface layer 50, first conductive layer 54, and intermediate layer 56, to contact an appropriate lower flex contact 44. Window 62 is opened through second outer surface layer 52 through which module contacts 38 pass to contact the appropriate lower flex contact 44.

Respective ones of contacts 28 of second level CSP 16 and first level CSP 18 are connected at the second conductive layer 58 level in flex circuits 30 and 32 to interconnect appropriate signal and voltage contacts of the two CSPs. In a preferred embodiment, respective contacts 28 of second level CSP 16 and first level CSP 18 that convey ground (VSS) signals are connected at the first conductive layer 54 level in flex circuits 30 and 32 by vias that pass through intermediate layer 56 to connect the levels as will subsequently be described in further detail. Thereby, CSPs 16 and 18 are connected. Consequently, when flex circuits 30 and 32 are in place about first level CSP 18, respective contacts 28 of each of CSPs 16 and 18 are in contact with upper and lower flex contacts 42 and 44, respectively. Selected ones of upper flex contacts 42 and lower flex contacts 44 are connected. Consequently, by being in contact with lower flex contacts 44, module contacts 38 are in contact with both CSPs 16 and 18.

Figure 16:
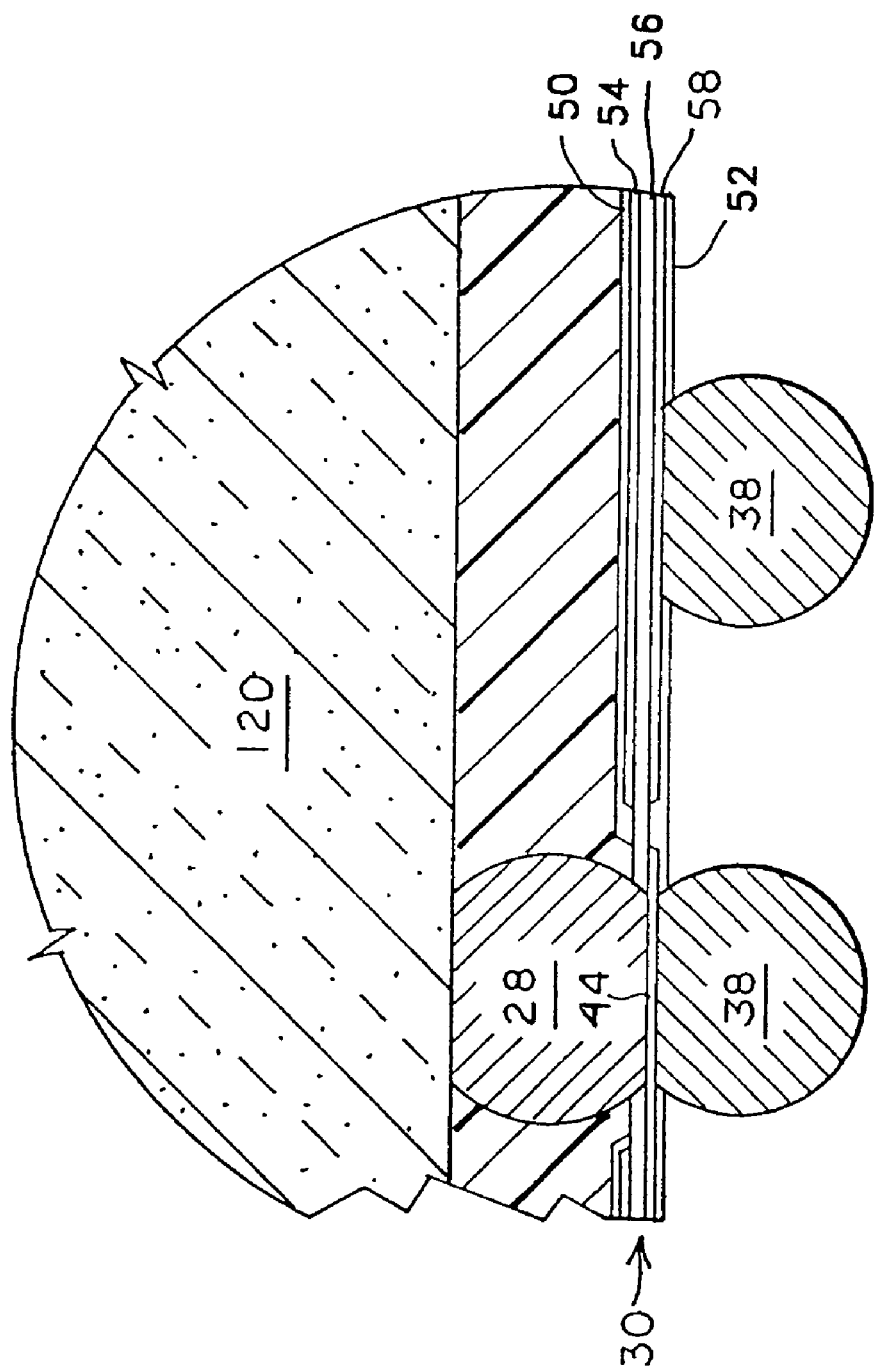
FIG. 16 depicts in enlarged view, an alternative connection strategy between constituent elements of a module and a flex in a preferred embodiment in accordance with the present invention.

In a preferred embodiment, module contacts 38 pass through windows 62 opened in second outer layer 52 to contact lower CSP contacts 44. In some embodiments, as is shown in FIG. 16, module 10 will exhibit a module contact array that has a greater number of contacts than do the constituent CSPs of module 10. In such embodiments, some of module contacts 38 may contact lower flex contacts 44 that do not contact one of the contacts 28 of first level CSP 18 but are connected to contacts 28 of second level CSP 16. This allows module 10 to express a wider datapath than that expressed by the constituent CSPs. A module contact 38 may also be in contact with a lower flex contact 44 to provide a location through which different ICs in the module may be enabled when no unused contacts are available or convenient for that purpose.

In a preferred embodiment, first conductive layer 54 is employed as a ground plane, while second conductive layer 58 provides the functions of being a signal conduction layer and a voltage conduction layer. Those of skill will note that roles of the first and second conductive layers may be reversed with attendant changes in windowing and use of commensurate interconnections.

Figure 6:
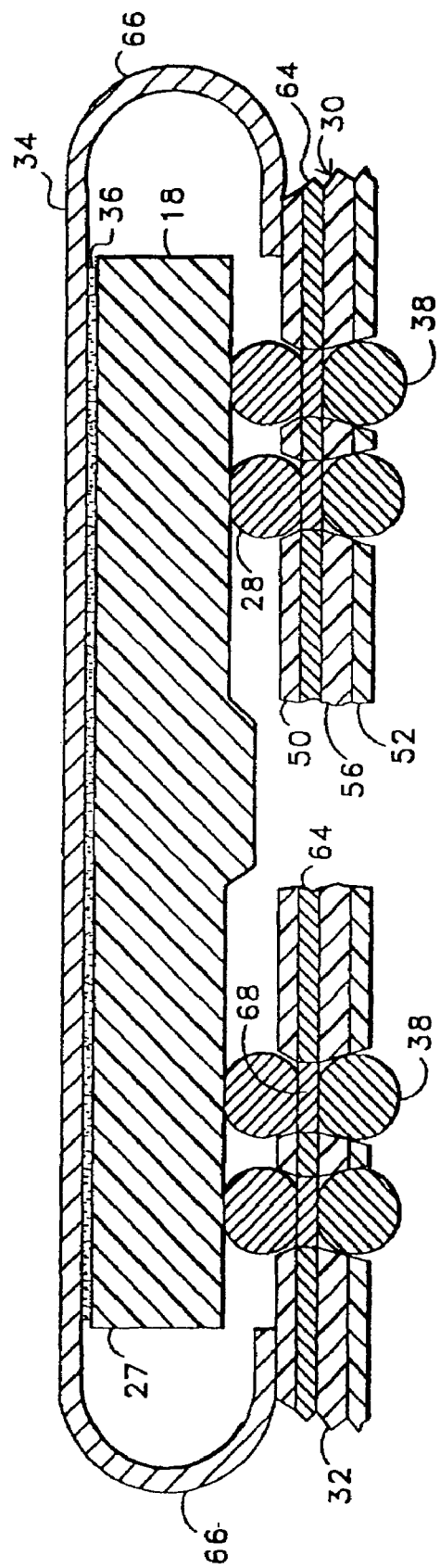
FIG. 6 depicts a flexible circuit connective set of flex circuits that has a single conductive layer.

FIG. 6 depicts a flexible circuit connective set of flex circuits 30 and 32 that has a single conductive layer 64. It should be understood with reference to FIG. 6 that flex circuits 30 and 32 extend further than shown and have portions which are, in the construction of module 10 brought about the curvature areas 66 of form standard 34 that mark the lateral extent of this example of a preferred form standard and are then disposed above the body of CSP 18 or the respective CSP of the module and therefore, the form standard. In this single conductive layer flex embodiment of module 10, there are shown first and second outer layers 50 and 52 and intermediate layer 56. Also shown in FIG. 6 are a set of single layer lower flex contacts 68 demarked at the level of conductive layer 64.

Form standard 34 is shown attached to the body 27 of first level CSP 18 through an adhesive. In some embodiments, it may also be positioned to directly contact body 27 of the respective CSP. Form standard 34 may take many different configurations to allow a connective flex circuitry to be prepared exhibiting a single set of dimensions which may, when used in conjunction with form standard 34, be employed to create stacked modules 10 from CSPs of a variety of different dimensions. In a preferred embodiment, form standard 34 will present a lateral extent broader than the upper major surface of the CSP over which it is disposed. Thus, the CSPs from one manufacturer may be aggregated into a stacked module 10 with the same flex circuitry used to aggregate CSPs from another manufacturer into a different stacked module 10 despite the CSPs from the two different manufacturers having different dimensions.

Further, heat transference can be improved with use of a form standard 34 comprised of heat transference material such as a metal or preferably, copper or a copper compound or alloy to provide a significant sink for thermal energy. Such thermal enhancement of module 10 particularly presents opportunities for improvement of thermal performance where larger numbers of CSPs are aggregated in a single stacked module 10.

Figure 7:
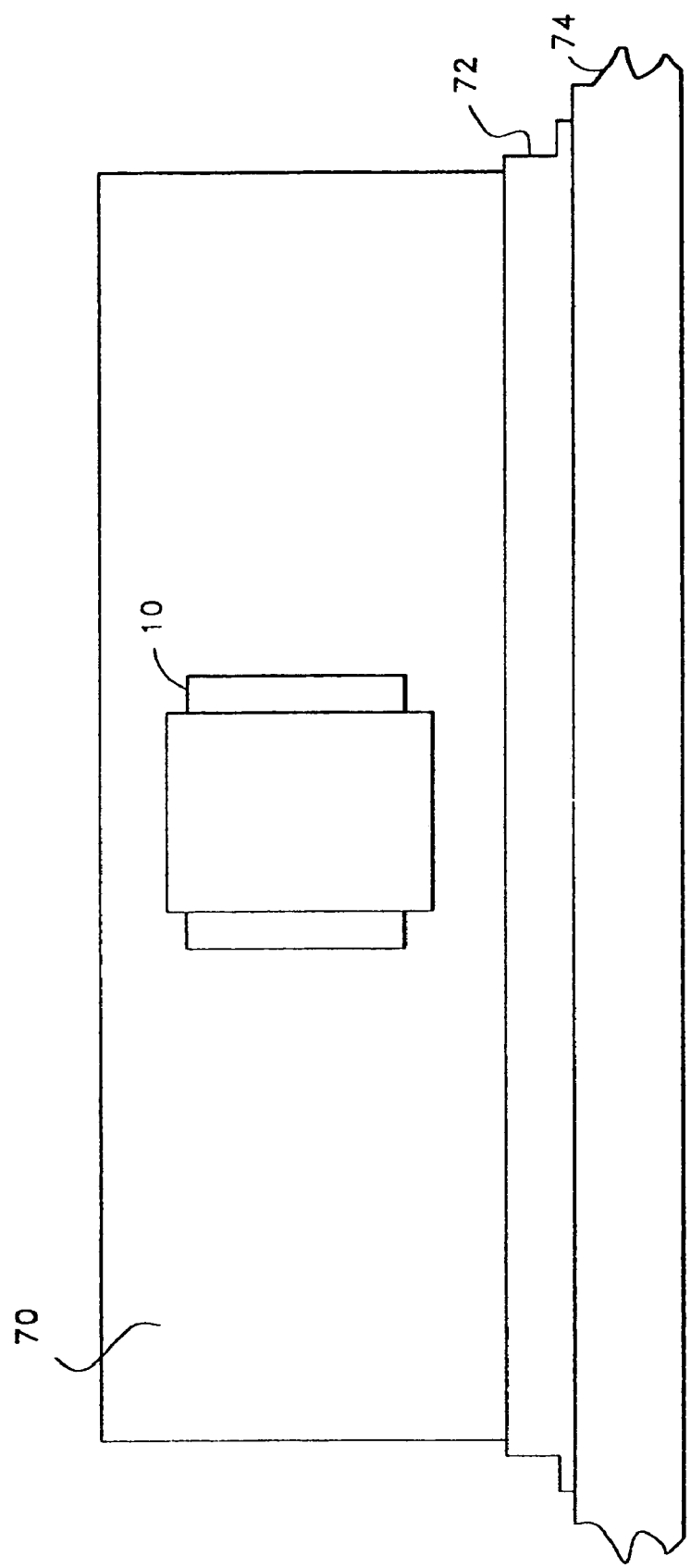
FIG. 7 depicts a four-high stacked module mounted on a memory expansion board in accordance with a preferred embodiment of the present invention.

FIG. 7 depicts a four-high stacked module 10 mounted on a memory expansion board 70 in accordance with a preferred embodiment of the present invention. As do typical DIMM boards, expansion board 70 shown in FIG. 7 has a set of contacts along one edge that as depicted are set in socket connector 72. Those contacts connect module 10 to a logic system on or connected to board 74 on which expansion board 70 is mounted. It should be understood that in a preferred embodiment of the memory expansion system and method provided herein, expansion board 70 will be populated with nine such modules 10 per side for a total of 72 devices if the stacked modules are each comprised from four devices.

Figure 8:
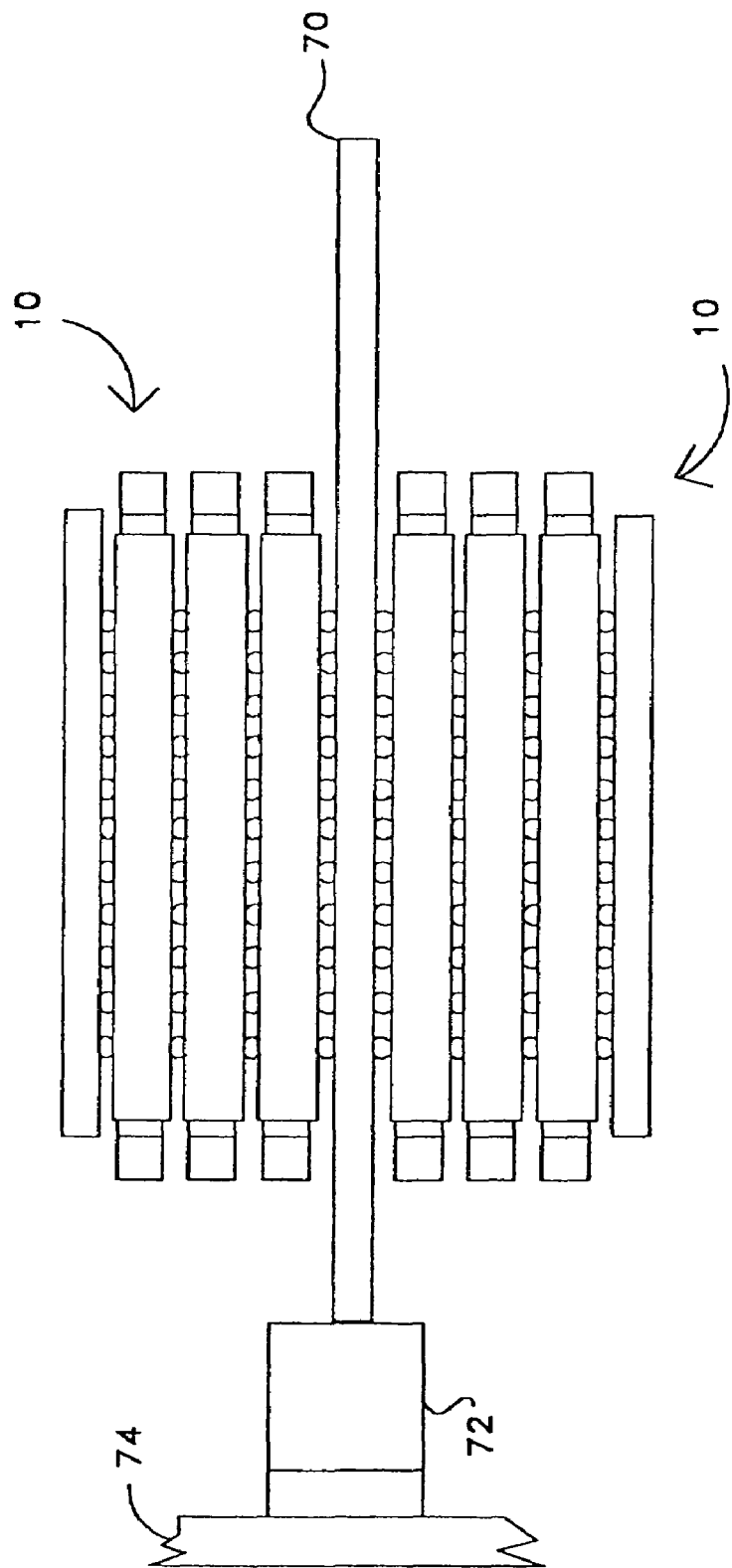
FIG. 8 depicts a memory expansion board or DIMM mounted with four-high modules.

FIG. 8 depicts memory expansion board 70 mounted with four-high modules 10. As those of skill will recognize, using four-high stacked modules on expansion board 70 reduces the interconnect length for the number of devices accessed but increase the total number of devices and, therefore, the impedance and particularly, the capacitive loading presented by a densely populated DIMM board.

Figure 9:
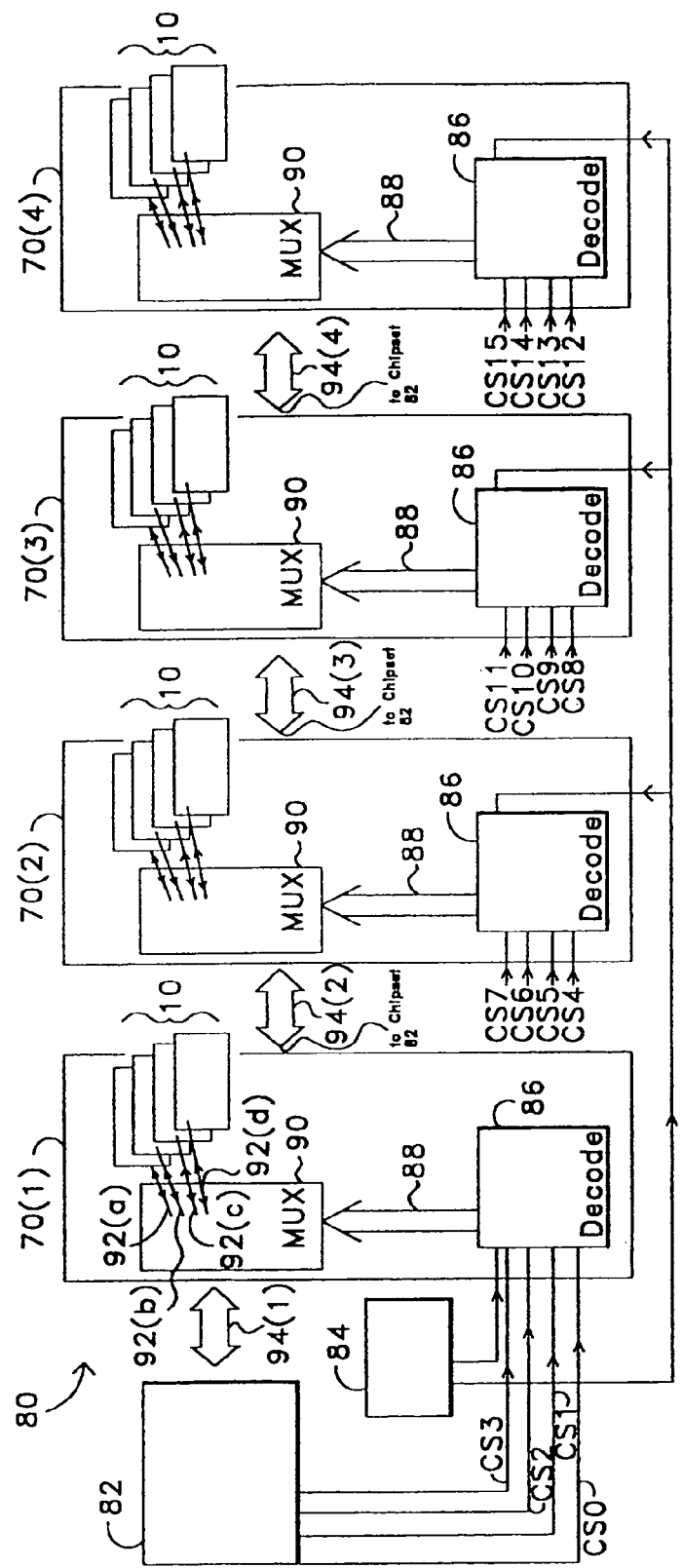
FIG. 9 depicts a memory system devised in accordance with the present invention.

FIG. 9 depicts a memory system 80 devised in accordance with the present invention. In a preferred mode, system 80 is employed with stacked modules 10 devised in accordance with the present invention. The preferred embodiment is for a DDRII registered DIMM populated with 4 high stacked modules 10 although it may be employed with an equivalent number of DRAMs, i.e., 72 devices of either leaded or CSP packaging aggregated in stacks of any number of levels.

Chipset 82 depicted in FIG. 9 typically includes a microprocessor or memory controller that controls the memory access with system 80. Clock 84 is provided to decode logic 86 on each of depicted memory expansion boards $70_{(1)}$, $70_{(2)}$, $70_{(3)}$, and $70_{(4)}$. Those of skill will understand that system 80 and its methods may be employed with one or more DIMMs or other memory expansion boards 70. It may also be employed off a memory expansion board to access separately, the integrated circuits from which stacked circuit modules are comprised. Decode logic 86 on each of memory expansion boards $70_{(1)}$, $70_{(2)}$, $70_{(3)}$, and $70_{(4)}$ provides a decoding of the respective CS signals provided to the respective memory expansion boards 70 as shown in FIG. 9. As those of skill will understand, the particular interconnection employed in the system should preferably be devised to minimize and balance power consumption across the circuit modules employed in the system.

As shown in the example depicted in FIG. 9, CS0, CS1, CS2, and CS3 are provided to memory expansion board $70_{(1)}$ from chipset 82 while CS4, CS5, CS6, and CS7 are provided to memory expansion board $70_{(2)}$ as are CS8, CS9, CS10, and CS11 provided to memory expansion board $70_{(3)}$ and CS12, CS13, CS14, and CS15 are provided to memory expansion board $70_{(4)}$.

In a preferred embodiment, memory expansion boards 70 are populated with nine four high CSP modules 10 per side. The depiction of FIG. 9 shows, however, only one module 10 per memory expansion board 70 to preserve clarity of the view. The shown module 10 is exploded to depict the four levels of module 10 which, in a preferred construction of module 10 include CSPs 18, 16, 14, and 12 with the form standard 34.

Thus, decode logic 86 may, on the appropriate signal from clock 84, generate a level select signal which, in a preferred embodiment, is a multi-bit signal that controls a multiplexing switch 90 associated with several data lines. Switch 90 is, in a preferred embodiment, a high speed switch and a FET multiplexer would provide a preferred multiplexing switch 90 in the practice of a preferred mode of the invention. The fan-out of multiplexing switch 90 may be any that provides a selection capability to a variety of device data lines from a DQ line from chipset 82. The DQ lines between chipset 82 and switches 90 are depicted by double-headed arrows 94(1), 94(2), 94(3) and 94(4). As with the depiction of stacked modules 10, only one multiplexing switch 90 is shown per memory expansion board 70, but those of skill will understand that multiple multiplexing switches 90 are employed in practice of the depicted preferred embodiment of the invention. The number of multiplexing switches 90 will depend upon the fan-out ratios. For example, use of nine 8:32 multiplexing switches 90 would be preferred (if available) or 4:8 or 1:4 multiplexing switches 90 will also provide advantages as an example. It should be understood that there are merely examples and that a variety of multiplexing switches and ratios may be employed for multiplexing switches 90, although the type of switch and the ratios will affect the loading figures. Consequently, a FET mux is preferred for multiplexing switch 90 and a ratio of 1:4 is one of the preferred ratios to employ.

The depiction in FIG. 9 is illustrative only and not meant to be limiting. For example, a single DIMM board or expansion board 70 may be employed in a system 80 in accordance with the present invention as well as larger numbers of expansion boards 70. The number of expansion boards 70 that may function in system 80 is partially a function of the access speeds required and the signal conformity.

An exemplar multiplexing switch 90 has multiple inputs 92(*a*), 92(*b*), 92(*c*), and 92(*d*) to provide independent data lines for each level of an exemplar module 10 populated upon the respective memory expansion board 70. Thus, with a 1:4 switch 90, there will be 18 iterations of multiplexing switch 90, one for each of the 18 four-high module 10's populating memory expansion board 70(1). Thus, the system 80 shown in FIG. 9 presents a total of 288 memory devices. It should be noted that system 80 may be employed with ICs of any package type and need not be limited to DDR or DDRII or even CSP.

The data line of each level of the constituent CSPs of each module 10 is connected to one input 92 of a corresponding exemplar multiplexing switch 90. In response to the CS signal 88 from decode logic 86 on a DIMM expansion board 70, multiplexing switch 90 connects the appropriate one of the DQ signals 94 to one of the four levels of a module 10 on that memory expansion board 70. This switching of the data bus through multiplexing switch 90 may, in some systems, required further control signal connections as those of skill in the art will recognize to accommodate the data latency of one or more clocks cycles, CAS latency, and burst length, for example. In a preferred mode, expansion board 70 may keep all the constituent devices of the modules 10 as if each constituent device of the modules 10 were the target, instead of having to switch terminations each time a different CS is chosen. In some applications it may be preferred to terminate the end of the data line past the last DIMM expansion board 70. Other features may enable improvements to the efficiency of system 80 such as creating more CS banks by decoding the chip select lines.

In the system 80, the capacitive load presented to chipset 82 would be approximately the combination of the input capacitance of switching multiplexer 90 times the number of DIMM slots plus one DRAM device load plus one times the output capacitance of the multiplexing switch 90. In large systems, this will reduce capacitive loading by a notable amount, thus allowing more DIMM slots at higher speeds and/or more densely populated DIMMs. Memory access system 80 provides an opportunity to improve high speed memory performance and allows use of memory expansion configurations that might not otherwise be available due to capacitive loading in conventional DIMM systems.

Figure 10:
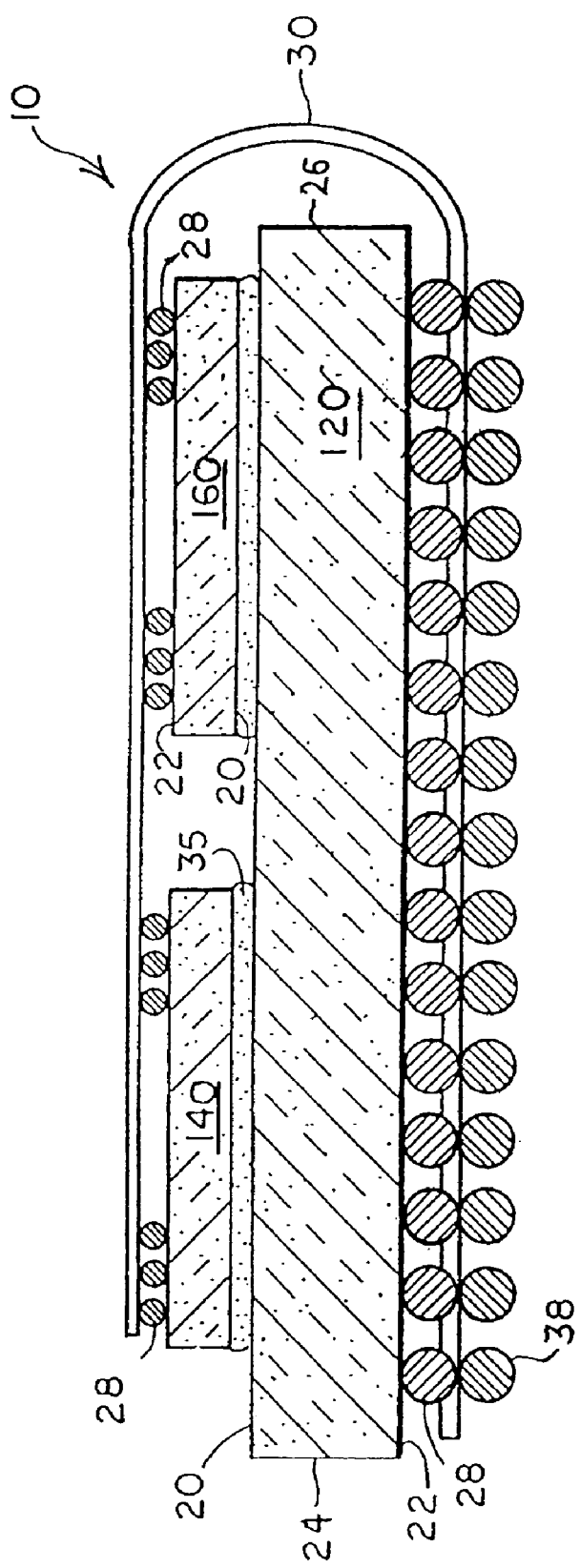
FIG. 10 is an elevation view of a module illustrating features of an alternative preferred embodiment of the present invention.

FIG. 10 is an elevation view of a module that depicts features of an alternative preferred embodiment of the present invention. The depicted module 10 is comprised of a base element 120 and support elements 140 and 160. In the depicted embodiment, base element 120 and support elements 140 and 160 are shown as CSP devices, but the invention is not limited to arrangements of CSPs and may be employed to aggregate a variety of package types. Base element 120 and support elements 140 and 160 each have, in the depicted embodiment, upper surfaces 20 and lower surfaces 22 and peripheral or lateral sides or edges 24 and 26 that may be in the character of sides or may, if the CSP is especially thin, be in the character of an edge.

FIG. 10 depicts base element 120 and support elements 140 and 160 in a stacked disposition with upper major surfaces of the constituent elements being proximally located in this back to back configuration. Between upper surfaces 20 of support elements 140 and 160 and upper surface 20 of base element 120 is shown adhesive layer 35 shown in exaggerated scale for clarity of depiction. Contacts 28 are emergent from lower surface 22 of base element 120 and support elements 140 and 160. Module contacts 38 are shown depicted along the bottom of module 10 and provide connection for the module to a PWB or PCB or other mounting site.

Support elements 140 and 160 are preferably fixed to upper surface 20 of base element 120 by adhesive 35 which is shown as a tape adhesive, but may be a liquid adhesive or may be placed in discrete locations across the package. Preferably, adhesive 35 is thermally conductive. Adhesives that include a flux may be used to advantage in assembly of module 10. Layer 35 may also be a thermally conductive medium to encourage heat flow between the elements of module 10. Alternatively, a mechanical clamp or clamps may be used to hold the base and support elements together. The contacts for the module itself may be closer to either the base element or the support element(s) of the module although more typically and preferably, the module contacts will be closer to the base element. The support elements may also extend over the edges of the base element or may be disposed within the perimeter of the base element. Although not shown in this view, use of a form standard 34 is preferred.

Figure 11:
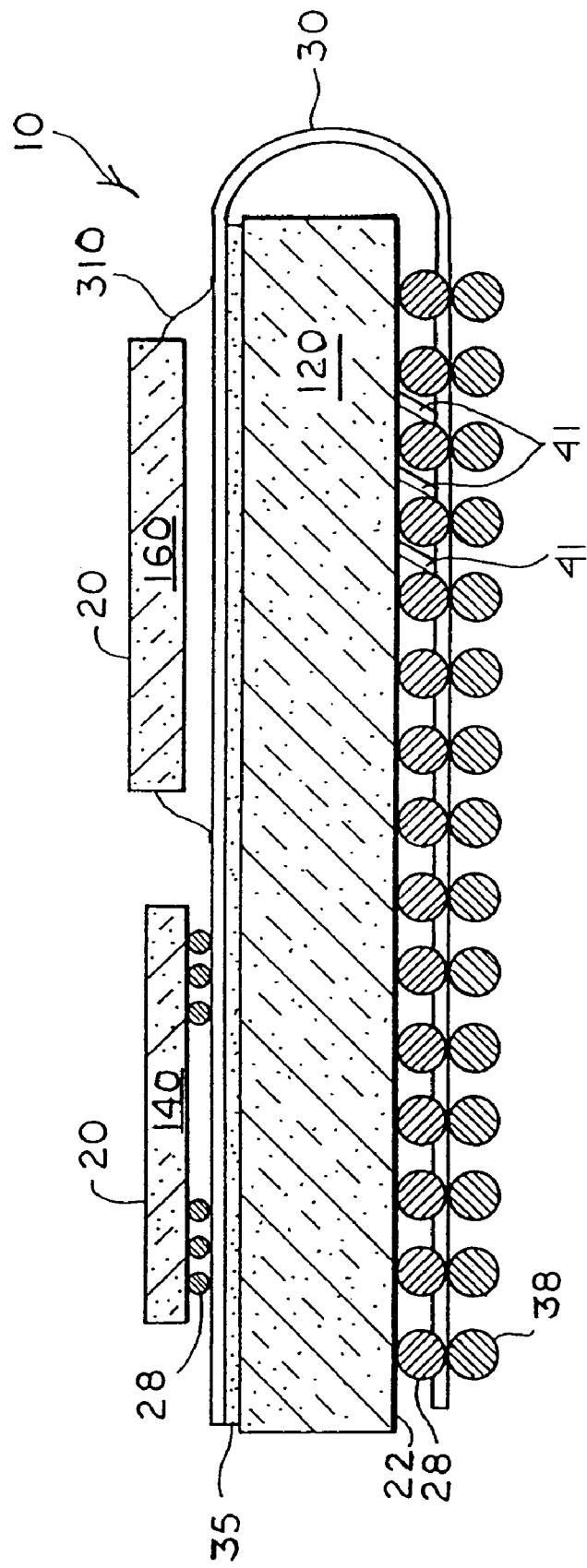
FIG. 11 is an elevation view of a module depicting features of an alternative preferred embodiment of the present invention.

FIG. 11 illustrates the aggregation of a leaded package device having leads 310 (i.e., as support element 160 in this embodiment) with base element 120 and support element 140. FIG. 11 further depicts the placement of flex 30 attached to the upper side of base element 120 with the placement of support elements 140 and 160 in a position relatively above flex 30 rather than below as earlier shown in FIG. 10. Flex 30 is preferably attached to upper surface 20 of base element 120 with a thermally conductive adhesive depicted by reference 35 in FIG. 11. A conformal media 41 is indicated in FIG. 11 as being placed between contacts 28 to assist in creating conformality of structural areas of module 10. Preferably, conformal media 41 is thermally conductive and is placed along the lower surface 22 of base element 120 although to preserve clarity of the view, its placement between only a few contacts 28 of base element 120 is shown in FIG. 11.

Figure 12:
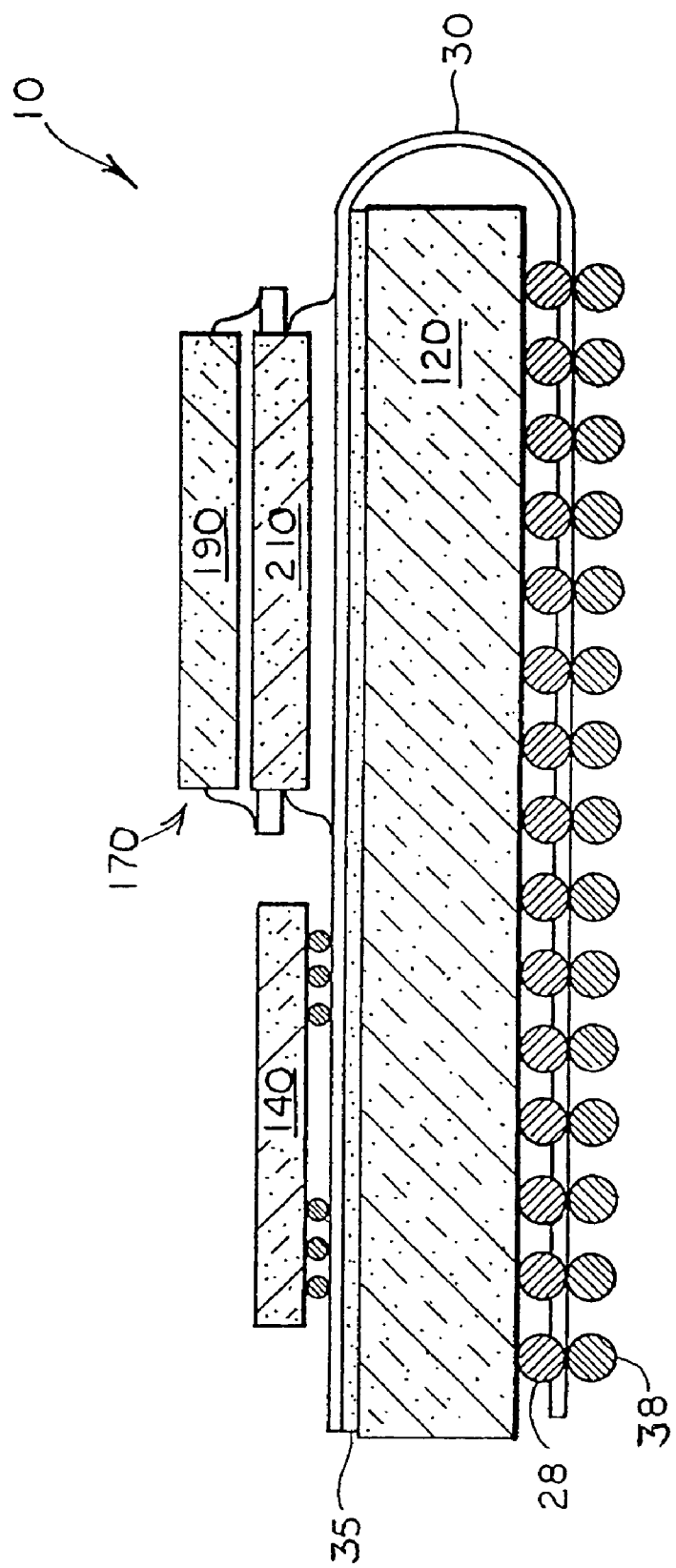
FIG. 12 is an elevation view of a module depicting features of an alternative preferred embodiment.

FIG. 12 depicts another alternative embodiment of the present invention. Shown are base element 120 and support element 140. In the place of previously shown single package support element 160 is leaded stack 170, consisting of upper IC 190 and lower IC 210.

Figure 13:
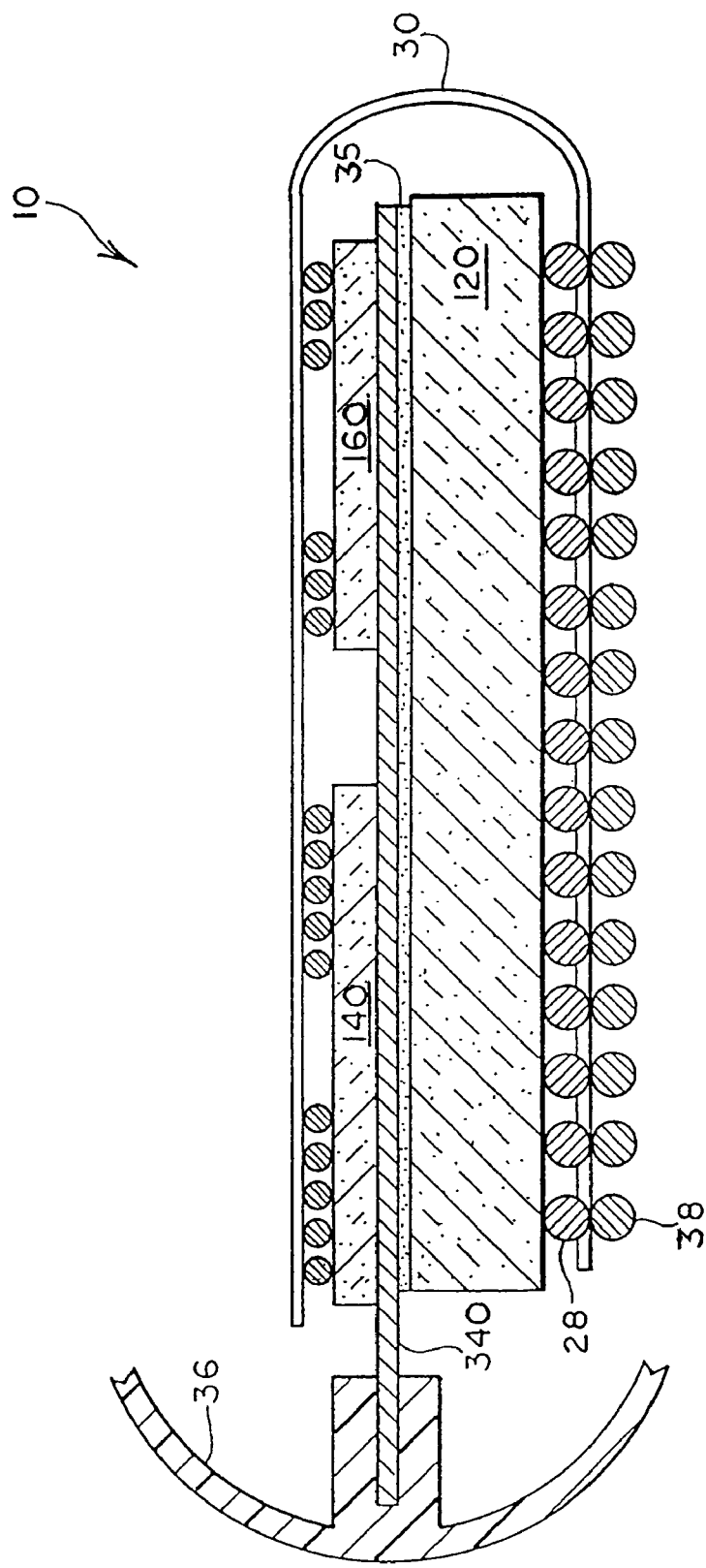
FIG. 13 is another view depicting features of an alternative preferred embodiment of the present invention.

FIG. 13 depicts a module that employs a CSP base element 120 and CSP support elements 140 and 160 interconnected with flex 30. Heat sink 340 is disposed between base element 120 and support elements 140 and 160. As shown in FIG. 13, heat sink 340 is in contact with a portion of casing 36 of an application in which module 10 is employed.

FIG. 14 is an alternative preferred embodiment of the present invention. Depicted in FIG. 14 are base element 120 and support elements 140 and 160 with all of the depicted ICs being packaged in CSP with support elements 140 and 160 extending beyond the physical boundaries of base element 120. Form standard 34 provides a standard form about which flex circuit 30 arcs. As earlier described, form standards may take a variety of forms and, in this embodiment, form standard 34 is folded to increase cooling surface area while providing an appropriate axial circumference and standard form for flex 30. Also shown is extensive and preferred use of conformal underfill 41.

Figure 15:
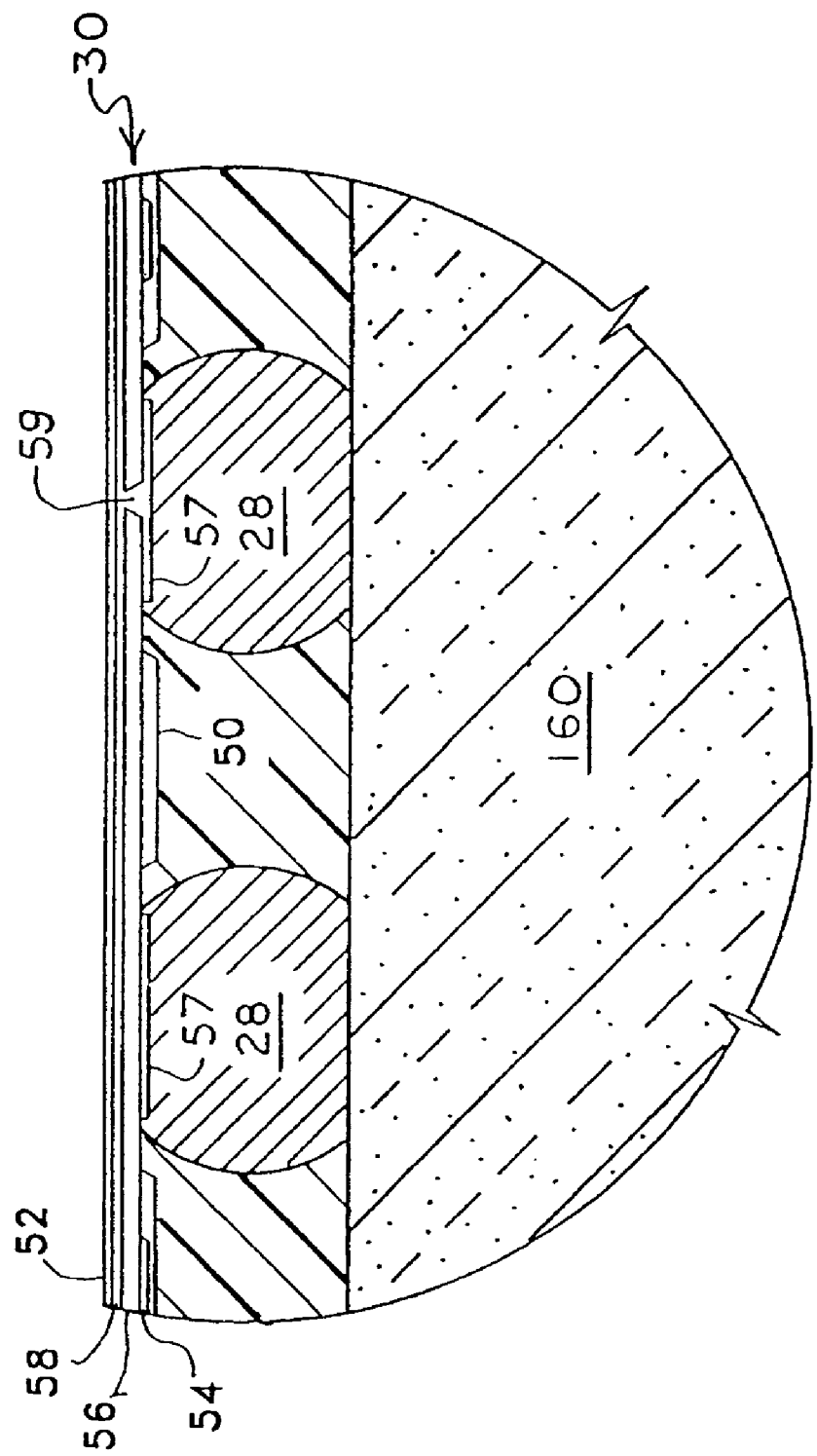
FIG. 15 depicts, in enlarged view, the area marked "C" in FIG. 14.

FIG. 15 illustrates in enlarged perspective, detail of the area marked "C" in FIG. 14 and illustrates an exemplar connection between example contacts 28 of a support element and support flex contacts 57 of flex 30. In this depiction, support flex contacts 57 are shown as being at the level of first conductive layer 54 of flex 30. FIG. 15 illustrates a via 59 between the support flex contact 57 in contact with the rightmost depicted contact 28 and second conductive layer 58. The use of vias between conductive layer levels allows flexibility in strategies employed to connect base element 120 with support elements and allows, for example, the connection of a contact from support elements 140 or 160 to a selected module contact 38. Often, support elements 140 and/or 160 will have signals that are not directly connected to base element 120, but which have functionality relevant to the operation of entire module 10. In such cases, a module contact 38 provides that signal connection to support element 140 or 160 without a corresponding direct connection to base element 120. Such a connection strategy is shown in FIG. 16.

Figure 17:
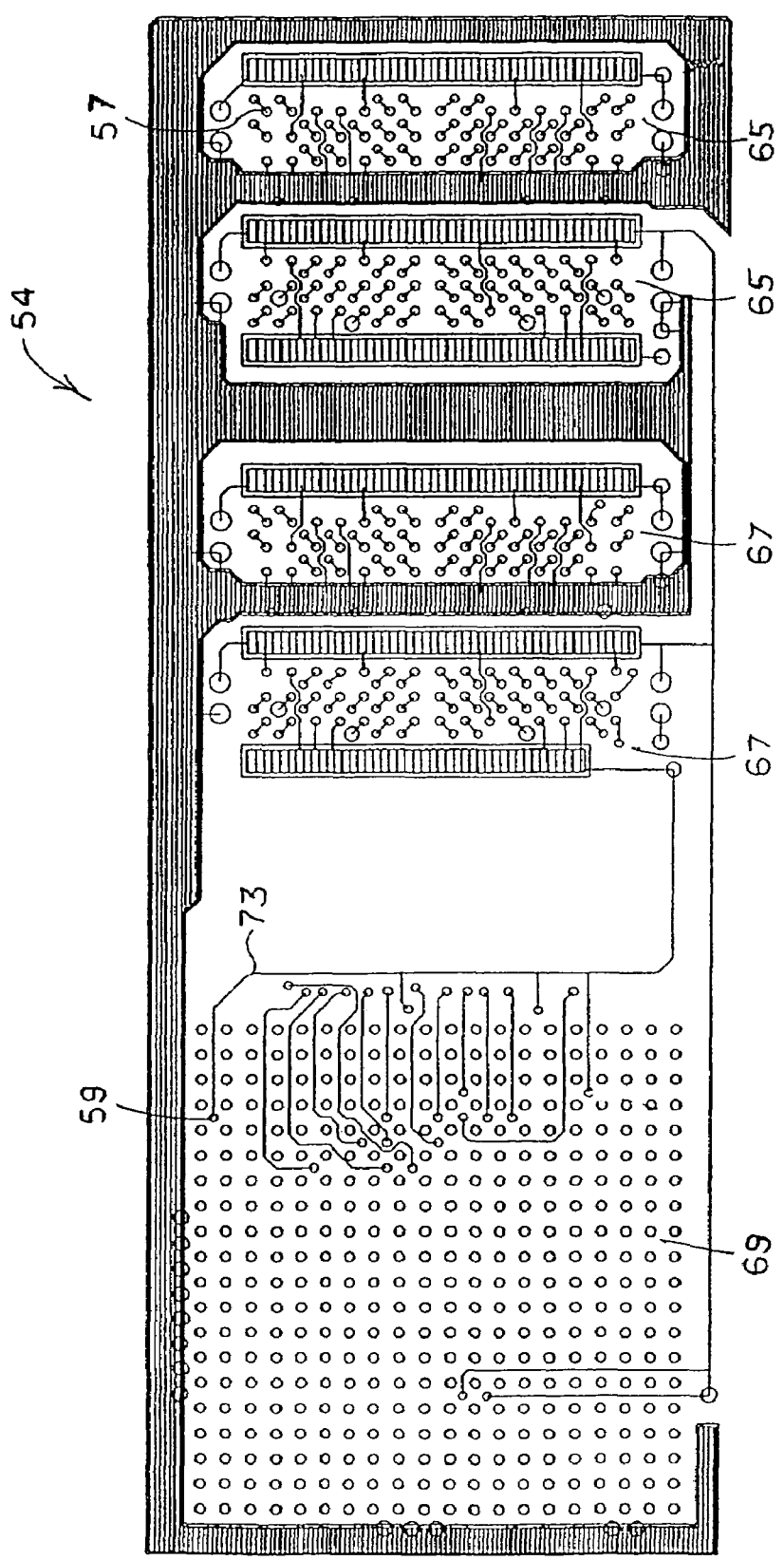
FIG. 17 depicts an exemplar first conductive layer of a flex employed in a preferred embodiment of the invention.

FIG. 17 illustrates an abstraction of the plot employed for the conductive areas at the level of first conductive plane 54 for a preferred embodiment similar to that depicted in FIG. 14. As those of skill will notice, in the plot shown in FIG. 17, the connective fields identified with references 65 roughly correspond to connective areas for support element 140 while connective fields identified with references 67 roughly correspond to support element 160 as shown in FIG. 14. Connective field 69 provides connections for base element 120. The connective fields 65 and 67 provide support flex contacts 57 as well as traces that, combined with vias 59, provide part of the connective facility for interconnecting support elements 140 and 160 to base element 120. The view is abstracted with many of the actual routing lines removed to assist in the clarity of the view.

Figure 18:
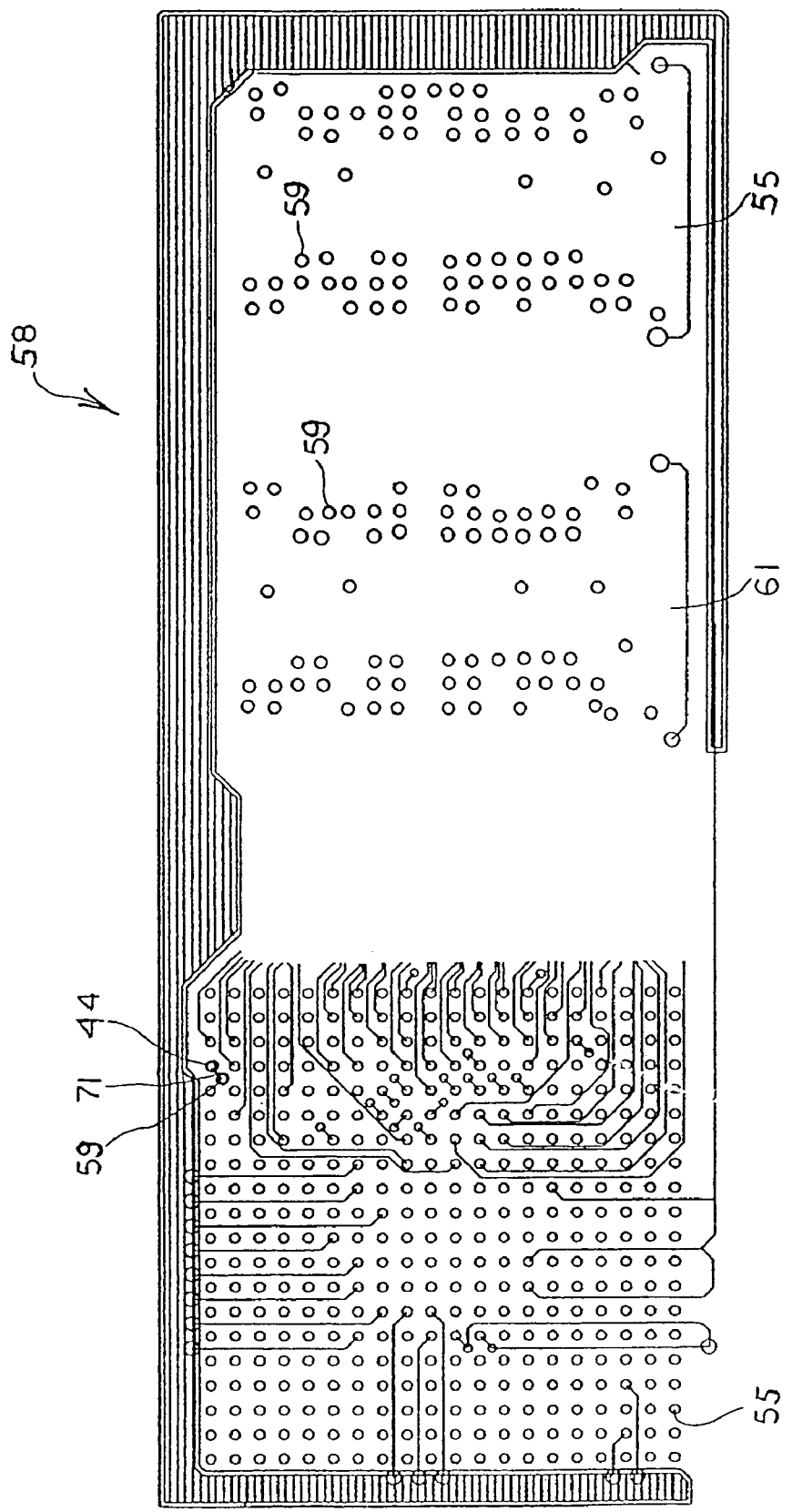
FIG. 18 depicts an exemplar second conductive layer of a flex employed in a preferred embodiment of the invention.

FIG. 18 illustrates an abstraction of the routing plot employed for conductive areas at the level of second conductive surface or plane 58 for a preferred embodiment similar to that depicted in FIG. 14.

In the area of FIGS. 17 and 18 employed to connect base element 120, there is illustrated an example of using vias 59 to more fully employ the two conductive layers of the preferred embodiments. Connective fields 55 and 61 indicate vias 59 as well as traces (that are not shown in the depiction for clarity of view) that provide part of the connective facility for interconnecting support elements 140 and 160 to base element 120.

On the depiction of FIG. 18, there is found the identification of a lower flex contact 44 that may be employed by base element 120. With reference to earlier FIGS. 5 and 16, base element 120 has a contact 28 that passes through window 60 and therefore, first conductive layer 54 to contact the identified lower flex contact 44 at the level of the second conductive layer as shown in FIG. 18. It should be understood that this is a heuristic explanation and meant to be merely an example illustrating a feature found in some preferred embodiments of the invention.

The identified lower flex contact 54 at the level of second conductive layer 58 is connected to a via 59 by a trace 71. Via 59 passes in a relatively upward direction toward the body of base element 120. As via 59 passes upwardly through flex 30, it contacts a conductive area at the level of first conductive layer 54 as shown in FIG. 17 by the identification of via 59 in the field 69. The identified via 59 is then connected to trace 73 that provides a connection network to a variety of other contacts in the depicted embodiment. Thus, the use of two conductive layers is given an added flexibility by the illustrated use of vias through an intermediate layer.

Vias that route through intermediate layer 56 to interconnect traces or flex contacts or conductive areas at different conductive layers may be "on-pad" or coincident with the support or base flex contact to which they are connected. Such vias may also be "off-pad" and located near windows associated with the flex contacts from which signals are to be conveyed to another conductive layer. This provides added flexibility to connection schemes and layout routing.

Although the present invention has been described in detail, it will be apparent to those skilled in the art that the invention may be embodied in a variety of specific forms and that various changes, substitutions and alterations can be made without departing from the spirit and scope of the invention. The described embodiments are only illustrative and not restrictive and the scope of the invention is, therefore, indicated by the following claims.

The invention claimed is:

1. A high-density circuit module comprising:
a first CSP having an upper and a lower major surface and a set of CSP contacts along the lower major surface;
a second CSP having first and second lateral edges and upper and lower major surfaces and a set of CSP contacts along the lower major surface, the first and second lateral edges delineating an extent of the upper major surface of the second CSP;
a form standard that is provided as a rigid mandrel and that is initially disposed above the upper surface of the second CSP, the form standard defining a standard sized form and including a thermally conductive material; and
a flex circuit that is at least partially disposed about the form standard subsequent to the form standard being disposed above the upper surface of the second CSP, the form standard defining a cross-sectional shape of the flex circuit.

2. A memory access system comprising:
a memory expansion board;
a high-density circuit module devised in accordance with claim 1, the high-density circuit module being mounted on the memory expansion board;
a switching multiplexer mounted on the memory expansion board, the switching multiplexer for switching data lines between the first and second integrated circuits; and
a decode logic circuit for decoding chip selection signals from a control circuit and providing a switching multiplexer control signal.

3. A memory access system comprising:
a high-density circuit module devised in accordance with claim 1;
a switch for connecting a datapath to one of the plural integrated circuits of the high-density circuit module;
a decode logic for generating a control signal that causes the switch to connect the datapath to one of the plural integrated circuits in response to a combination signal comprised of a clock signal and a chip select signal.

4. A memory access system comprising:
plural memory expansion boards each populated with plural high-density circuit modules, each of which plural high-density circuit modules being devised in accordance with claim 1;
plural multiplexers mounted upon each of the plural memory expansion boards, the plural multiplexers for making connections between a datapath and single ones of the plural integrated circuits comprising the high-density circuit modules;
decode logic on each of the plural memory expansion boards, the decode logic for generating a control signal in response to a combination signal comprised of a clock signal and a chip select signal, the control signal causing at least one of the plural multiplexers to connect a particular datapath to a particular one of the plural integrated circuits.

5. A memory access system comprising:
a memory board having a board memory signal data connection that provides a connection for memory signals between a plurality of integrated circuits mounted on the memory board and memory control circuitry;
a high-density circuit module comprised of first, second, third, and fourth individual integrated circuits, the high-density circuit module being mounted on the memory board and devised in accordance with claim 1;
a switching multiplexer mounted on the memory board, the switching multiplexer having a set of plural input data connections, individual ones of the plural input data connections connected to provide individual data connections between each of the first, second, third, and fourth individual integrated circuits and the switching multiplexer; and
a decode logic circuit for decoding chip selection signals from a control circuit and providing a switching multiplexer control signal.

6. A memory access system comprising:
X memory expansion boards each populated with Y high-density circuit modules devised in accordance with claim 1, each of which Y high-density circuit modules being comprised of Z individual integrated circuits;
plural multiplexers mounted upon each of the X memory expansion boards, the plural multiplexers each for selectively making connections between a datapath and single ones of the Z integrated circuits comprising each of the y high-density circuit modules;
decode logic on each of the plural memory expansion boards, the decode logic for generating a control signal in response to a combination signal comprised of a clock signal and a chip select signal, the control signal causing at least one of the plural multiplexers to connect a particular datapath to a particular one of the Z integrated circuits.

7. The memory access system of claim 3 in which the plural integrated circuits of the high-density circuit module number four.

8. The memory access system of claim 4 in which the multiplexers are FET multiplexers.

9. The memory access system of claim 4 in which the plural high-density circuit modules are comprised of four integrated circuits.

10. The memory access system of claim 4 in which the plural high-density circuit modules are comprised from two integrated circuits.

11. The memory access system of claim 5 in which the switching multiplexer further comprises an output data connection connected to the board signal memory data connection.

12. The memory access system of claim 5 in which the decode logic circuit is mounted on the memory board.

13. The memory access system of claim 6 in which the multiplexers are FET multiplexers.

14. The memory access system of claim 6 in which Z equals 4.

15. The memory access system of claim 6 in which Z equals 2.

16. The memory access system of claim 11 in which the switching multiplexer provides selective individual connection between the board signal memory data connection and the first, second, third, and fourth individual integrated circuits.

17. The memory access system of claim 16 in which the individual connection between the board signal memory data connection and the first, second, third, and fourth individual integrated circuits occurs in response to the switching multiplexer control signal from the decode logic circuit.

* * * * *

UNITED STATES PATENT AND TRADEMARK OFFICE
CERTIFICATE OF CORRECTION

PATENT NO. : 7,542,304 B2  
APPLICATION NO. : 10/804452  
DATED : June 2, 2009  
INVENTOR(S) : Russell Rapport Page 1 of 1

It is certified that error appears in the above-identified patent and that said Letters Patent is hereby corrected as shown below:

In Claim 6, column 14, line 52, delete "y" and insert -- Y --, therefor.

In Claim 8, column 14, line 64, delete "arc" and insert -- are --, therefor.

In Claim 10, column 15, line 2, delete "arc" and insert -- are --, therefor.

Signed and Sealed this

Fourth Day of August, 2009

JOHN DOLL  
*Acting Director of the United States Patent and Trademark Office*